(12) United States Patent
Schwartzburg et al.

(10) Patent No.: US 12,001,011 B2
(45) Date of Patent: Jun. 4, 2024

(54) OPTICAL ELEMENT AND A METHOD OF VISUALLY AUTHENTICATING AN OBJECT

(71) Applicant: SICPA HOLDING SA, Prilly (CH)

(72) Inventors: Yuliy Schwartzburg, Lausanne (CH); Romain Testuz, Lausanne (CH); Andrea Callegari, Ecublens (CH)

(73) Assignee: SICPA HOLDING SA, Prilly (CH)

( * ) Notice: Subject to any disclaimer, the term of this patent is extended or adjusted under 35 U.S.C. 154(b) by 0 days.

(21) Appl. No.: 17/917,845

(22) PCT Filed: Apr. 7, 2021

(86) PCT No.: PCT/EP2021/059011
§ 371 (c)(1),
(2) Date: Oct. 7, 2022

(87) PCT Pub. No.: WO2021/204844
PCT Pub. Date: Oct. 14, 2021

(65) Prior Publication Data
US 2023/0288697 A1    Sep. 14, 2023

(30) Foreign Application Priority Data
Apr. 7, 2020   (EP) .................... 20168421

(51) Int. Cl.
*G02B 26/08*    (2006.01)
*B42D 25/30*    (2014.01)
(Continued)

(52) U.S. Cl.
CPC ......... *G02B 26/0875* (2013.01); *B42D 25/30* (2014.10); *B42D 25/405* (2014.10);
(Continued)

(58) Field of Classification Search
CPC ...... G02B 26/0875; G02B 26/08; G02B 1/10; G02B 27/18; B42D 25/30; B42D 25/405; B42D 25/324; G03F 1/68
(Continued)

(56) References Cited

U.S. PATENT DOCUMENTS

| | | |
|---|---|---|
| 9,188,783 B2 | 11/2015 | Papas et al. |
| 2016/0041398 A1 | 2/2016 | Papas et al. |
| 2020/0269627 A1* | 8/2020 | Callegari ............. G02B 5/1842 |

FOREIGN PATENT DOCUMENTS

| | | |
|---|---|---|
| AU | 2011101251 | 11/2011 |
| EP | 2711745 | 3/2014 |

(Continued)

OTHER PUBLICATIONS

J.A. Nelder and R. Mead, "A simplex method for function minimization", The Computer Journal, vol. 7 (4), 1965, pp. 308-313.

(Continued)

*Primary Examiner* — Justin V Lewis
(74) *Attorney, Agent, or Firm* — Muncy, Geissler, Olds & Lowe, P.C.

(57) ABSTRACT

The invention relates to an anti-copy optical element comprising a caustic layer and a mask layer configured to simultaneously display a visible image reproducing a reference image and form a projected image containing a visible caustic pattern reproducing a reference pattern, upon illumination of the optical element with a light source, the projected image being distinct from the reference image. The invention also relates to a method for designing a relief pattern of a light-redirecting surface of said caustic layer consistently with the transmission properties of the mask layer.

15 Claims, 9 Drawing Sheets

(51) Int. Cl.
*B42D 25/405* (2014.01)
*G02B 1/10* (2015.01)
*G02B 27/18* (2006.01)
*G03F 1/68* (2012.01)

(52) U.S. Cl.
CPC ............... *G02B 1/10* (2013.01); *G02B 27/18* (2013.01); *G03F 1/68* (2013.01)

(58) Field of Classification Search
USPC .............. 283/67, 70, 72, 74, 87, 94, 98, 901
See application file for complete search history.

(56) References Cited

FOREIGN PATENT DOCUMENTS

| EP | 2963464 | 1/2016 | | |
|---|---|---|---|---|
| WO | 1999037488 | 7/1999 | | |
| WO | 2019063778 | 4/2019 | | |
| WO | 2019063779 | 4/2019 | | |
| WO | WO-2019063778 A1 | * | 4/2019 | ............. B42D 25/23 |

OTHER PUBLICATIONS

Stephen J. Wright, "Coordinate Descent Algorithms", Mathematical Programming, vol. 151 (1), Jun. 2015, pp. 3-34.
W. Huyer and A. Neumaier, "Global Optimization by Multilevel Coordinate Search", Journal of Global Optimization, vol. 14 (4), Jun. 1999, pp. 331-355.
Press, WH; Teukolsky, SA; Vetterling, WT; Flannery, BP (2007). "Section 10.5. Downhill Simplex Method in Multidimensions". Numerical Recipes: The Art of Scientific Computing (3rd ed.). New York: Cambridge University Press., 2007, ISBN 978-0-521-88068-8.
F. de Goes et al., "Blue Noise through Optimal Transport", CAN Transactions on Graphics, vol. 31 (6), (SIGGRAPH Asia) 2012 (the web site http://www.geometry.caltech.edu/BlueNoise/), 10 pages.
Mario Papas et al : "Goal-based Caustics", Computer Graphics Forum : Journal of the European Association for Computer Graphics, vol. 30, No. 2, Apr. 28, 2011 (Apr. 28, 2011), pp. 503-511.
International Search Report and Written Opinion issued with respect to application No. PCT/EP2021/059011.

* cited by examiner

OPTICAL ELEMENT AND A METHOD OF VISUALLY AUTHENTICATING AN OBJECT

TECHNICAL FIELD

The present invention relates to the technical field of designing caustic optical elements, in particular to designing a refractive transparent or partially transparent light-redirecting surface (or a reflective light-redirecting surface) of a caustic layer, and to refractive/reflective optical security elements operable to project caustic patterns upon appropriate illumination.

BACKGROUND OF THE INVENTION

There is a need for security features on objects, that can be authenticated by the so-called "person in the street", using commonly available means. These means include using the five senses—mostly, sight and touch—plus using widespread tools, such as for example a mobile phone.

Some common examples of security features are forensic fibers, threads or foils (incorporated into a substrate like paper for example), watermarks, intaglio printing or micro-printing (possibly printed on a substrate with optically variable inks) which can be found on banknotes, credit cards, ID's, tickets, certificates, documents, passports etc. These security features can include optically variable inks, invisible inks or luminescent inks (fluorescing or phosphorescing under appropriate illumination with specific excitation light), holograms, and/or tactile features. A main aspect of a security feature is that it has some physical property (optical effect, magnetic effect, material structure or chemical composition) that is very difficult to counterfeit so that an object marked with such a security feature may be reliably considered as genuine if the property can be observed or revealed (visually or by means of a specific apparatus).

However, when the object is transparent, or partially transparent, these features may not be appropriate. In fact, transparent objects often require that the security element having the required security features does not change their transparency or their appearance, either for aesthetic or for functional reasons. Notable examples may include blisters and vials for pharmaceutical products. Recently, for example, polymer and hybrid banknotes have incorporated in their design a transparent window, thus generating the desire for security features that are compatible with it.

Most existing security features for documents, banknotes, secured tickets, passports, etc. have not been specifically developed for transparent objects/areas and, as such, are not well-suited for such an application. Other features, for example, those obtained with invisible and fluorescent inks require specific excitation tools and/or detection tools, which may not be readily available for "the person in the street".

Semi-transparent optically variable features (e.g. liquid crystal coatings, or latent images from surface structures) are known and can provide this kind of functionality. Unfortunately, the marking incorporating such security features generally must be observed against a dark/uniform background for the effect to be well visible.

Other known features are diffractive optical elements, such as non-metallized surface holograms. A disadvantage with these features is that they show a very low contrast visual effect when viewed directly. Furthermore, when used in combination with a monochromatic light source to project a pattern, they typically require a laser to give a satisfactory result. Moreover, a quite precise relative spatial arrangement of the light source, the diffractive optical element and the user's eyes is required in order to provide a clearly visible optical effect.

Laser engraved micro-text and or micro-codes have been used for e.g. glass vials. However, they require expensive tools for their implementation, and a specific magnifying tool for their detection.

The above mentioned problems have been overcome with optical (security) elements suitable for transparent or partially transparent objects by introducing a design methodology that uses a caustic layer having a refractive transparent or partially transparent light-redirecting surface, wherein the caustic layer has a relief pattern adapted to redirect incident light received from a light source and to form a projected image containing a caustic pattern that reproduces a target reference pattern.

This approach allows controlling the caustic pattern by shaping the surface of the caustic layer. The computational tools based on light transport have been developed to form almost any desired shape by optimizing (calculating) the geometry of the refractive or reflective surface of caustic optical elements starting from a target image. Caustic surfaces and methods for calculating said caustic surfaces starting from a target reference image have been disclosed in the prior art, for example:

- the European patent application EP2711745 A2 discloses discretizing the generated surface into a mesh, which is then deformed to adjust the brightness of the corresponding area of the image. The normal field associated with the mesh is then determined and integrated to find the corresponding caustic surface. However, given an arbitrary image, it is necessary to take additional precautions in order that the corresponding normal field will be integrable.
- the European patent application EP2963464 A1 takes a similar approach to determine an optimal transport map (OTM) and likewise requires calculating and integrating a normal field.
- the US patent U.S. Pat. No. 9,188,783B2 and the US patent application US2016041398 A1 divide the generated surface into a collection of micro-patches, each responsible for projecting a caustic Gaussian kernel, wherein the superposition of the kernels approximates the desired image. However, the method suffers from discretization artifacts and has difficulties in resolving low intensity regions. The normal field also needs to be integrated.
- the international patent applications WO2019063778 A1 and WO2019063779 A1 disclose an optical security element comprising a refractive light-redirecting surface having a relief pattern operable to redirect incident light from a light source and form a projected image on a projection surface, the projected image comprising a caustic pattern reproducing a reference pattern that is easily visually recognizable by a person.

However, these optical elements with a caustic surface have some drawbacks. Besides being vulnerable to wear and abrasion, the caustic surface can be copied by making a cast of its relief pattern. Moreover, the presence of the caustic surface modifies, to some extent, the appearance of the object, possibly making it less aesthetically pleasing, and/or attracting attention to the mechanism by which a caustic image is projected. Under certain circumstances, it is possible to guess the projected image merely from the shape of the surface, which decreases a surprise effect for a person having to use the optical element, e.g. by looking through the optical element (particularly if this "surprise" effect is associated with a secure aspect to be provided by the optical element).

It is thus an object of the present invention to provide an anti-copy optical element with a caustic surface which overcomes the above mentioned drawbacks.

It is a further object of the present invention to provide a marked object, selected from a group comprising consumer products, value documents (e.g. certificates, passports, identity documents, driver licenses . . . ) and banknotes, which comprises the improved optical element.

It is a further object of the present invention to provide a method of visually authenticating an object, marked with an optical element using commonly available means.

It is a further object of the present invention to use the optical element for authenticating or securing against counterfeiting an object selected from the group comprising consumer products, value documents and banknotes.

SUMMARY OF THE INVENTION

According to one aspect, the invention relates to an optical element comprising a caustic layer made of a piece of reflective, or refractive transparent or partially transparent, first optical material, and having a light-redirecting surface with a relief pattern, wherein:

the optical element includes a mask layer disposed, respectively, on an optical surface of the optical element or within the optical element, the mask layer comprising a mask pattern and having a variable light transmission coefficient, the mask layer being adapted to at least partially transmit incoming light upon illumination of the optical element with a point-like light source; and the relief pattern of the light-redirecting surface of the caustic layer is configured to redirect incident light received by the optical element from the point-like light source and form a projected image containing a visible caustic pattern reproducing a reference pattern.

The mask layer may be configured to show a visible image reproducing a reference image, the visible image being distinct from the projected image, upon illumination of the optical element with the point-like light source.

Preferably, a profile of a depth of the relief pattern has abrupt variations formed by machining a surface of the piece of first optical material according to a calculated relief pattern profile having discontinuities, said machined abrupt variations corresponding to the discontinuities. The profile of the relief pattern may have a maximum depth less than or equal to 250 µm. However, the profile of the relief pattern may preferably have a maximum depth less than or equal to 30 µm. According to a mode of realization of the invention, the light-redirecting surface of the optical element is disposed over a flat base substrate, and an overall thickness of the optical element is less than or equal to 100 µm. The relief pattern of the light-redirecting surface is preferably adapted to redirect incident light received from the light source, at a distance $d_s$ from the light-redirecting surface, and form the projected image containing the caustic pattern on a wall surface at a distance $d_i$ from the light-redirecting surface, with a value of $d_i$ less than or equal to 30 cm and a value of the ratio $d_s/d_i$ greater than or equal to 5.

According to another mode of realization, the optical element may further comprise a lens element adjacent to the caustic layer and made of a refractive transparent or partially transparent second optical material, the lens element being configured to redirect incident light received by the optical element from the light source to form the projected image containing the visible caustic pattern reproducing the reference pattern. The light-redirecting surface may have a focal length $f_C$, and the lens element a focal length $f_L$ configured to form the projected image containing the visible caustic pattern directly on a retina of an observer looking at the light source through the optical element. The optical element may comprise one of the following:

a) the caustic layer having a positive focal length ($f_C$>0) and the lens element having a negative focal length ($f_L$<0), or b) the caustic layer having a negative focal length ($f_C$<0) and the lens element having a positive focal length ($f_L$>0).

Preferably, a relationship between the focal length $f_L$ of the lens element and the focal length $f_C$ of the caustic layer satisfies following equation:

$$R - \left(\frac{1}{f_L} + \frac{1}{f_C} - \frac{1}{d_s}\right)^{-1} \geq d_R,$$

where:

R is distance between the caustic layer and an eye of the observer;

$d_s$ is a distance between the light source and the optical element; and $d_R$ is a comfortable reading distance from the eye, which is at least 25 cm.

The optical element according to the invention, may be used to mark an object selected from the group comprising: consumer products, value documents, tax stamps, and banknotes.

According to another aspect, the invention relates to a method of visually authenticating an object, marked with the above optical element with a mask layer, by an observer, comprising steps of:

illuminating the optical element with a point-like light source;

visually observing the projected image containing the visible caustic pattern reproducing the reference pattern; and deciding that the object is genuine upon evaluation by the observer that the caustic pattern is visually similar to the reference pattern.

In a preferred mode of realization, wherein, upon illumination of the optical element with the point-like light source, the mask layer is configured to show a visible image reproducing a reference image, the method comprises a further step of visually observing the visible image reproducing the reference image, and the step of deciding that the object is genuine comprises a further verification by the observer that the visible image is visually distinct from the caustic pattern.

A further aspect of the invention relates to a method of designing a relief pattern of a light-redirecting surface of a caustic layer made of a piece of refractive transparent or partially transparent, or reflective, first optical material, the caustic layer including a mask layer disposed, respectively, on an optical surface of the optical element or within the optical element, the mask layer comprising a mask pattern and having a variable light transmission coefficient, the mask layer being adapted to at least partially transmit incoming light upon illumination of the optical element with a point-like light source, the caustic layer being adapted to redirect incident light received from the point-like light source and form a projected image containing a caustic pattern, the method comprising the computer implemented steps of:

provyding a discrete representation of an input target image of a reference pattern comprising a set P of N image pixels $p_i$ of coordinates $\{(x_i,y_i)\}$ in the image plane with associated nonzero target light intensities $\{I_i\}$, i=1, ..., N, distributed within a given area of the target image and corresponding to a target caustic pattern of the target image;

computing a piecewise representation of the light-redirecting surface z=F(x,y) of the caustic layer, with height z above the (x,y) coordinates plane, based on a representation of the light-redirecting surface by means of intersecting pieces of surfaces $z=f_i(x,y)$, i=1, ..., N, respectively obtained from the stationarity of the optical path length of rays refracted, or reflected, by the caustic layer and focused on points P(i) of the image plane of coordinates $(x_i,y_i)$, i=1, ..., N, wherein each piece of surface $z=f_i(x,y)$ is a surface of revolution around an axis passing through the point P(i) and having a vertex at point $(x_i,y_i,z_i)$, with height $z_i=f_i(x_i,y_i)$, i=1, ..., N, the piecewise representation of the light-redirecting surface associated with respective values of the heights of the N vertices being formed by an envelope of the intersections of the corresponding N pieces of surfaces $z=f_i(x,y)$, i=1, ..., N;

for a given set of respective values of heights $z_1, ..., z_N$ of the vertices of the N pieces of surfaces, calculating a corresponding set of values of light intensities I(1), ..., I(N) which are respectively focused on the points P(1), ..., P(N) by the caustic layer redirecting incident light via the associated piecewise light-redirecting surface according to the variable light transmission coefficient of the mask pattern; and calculating the respective values of the N heights $z_1, ..., z_N$ of the N vertices of the corresponding N pieces of surfaces which minimize the differences between the respective values of calculated light intensities I(1), ..., I(N) focused on the points P(1), ..., P(N) via the associated light-redirecting surface and the respective corresponding values of the target light intensities $I_1, ..., I_N$, thereby obtaining the light-redirecting surface having a relief pattern adapted to redirect incident light received from the light source by the optical element comprising the mask layer and form a projected image containing the target caustic pattern reproducing the reference pattern.

Each piece of surface $z=f_i(x,y)$, i=1, ..., N, may be approximated by taking, within the paraxial approximation, a Taylor expansion of order k greater or equal than two of the expression of the piece of surface obtained from the stationarity of the optical path length. The step of calculating the heights $z_i$ minimizing the differences between the calculated light intensities I(i) and the corresponding target light intensities $I_i$, for i=1, ..., N, may be performed by means of a gradient-free optimization method. Alternatively, the step of calculating the heights $z_i$ minimizing the differences between the calculated light intensities I(i) and the corresponding target light intensities $I_i$, for i=1, ..., N, may be performed by means of an optimization method resorting to a power diagram for the computation of an associated cost function and its derivatives.

The designed light-redirecting surface may be used to generate a machine-compatible representation for controlling a machining tool to machine the light-redirecting surface of the caustic layer. Said machine-compatible representation may use, for example, the industry standard formats such as STereoLithography (STL) or Initial Graphics Exchange Specification (IGES). Particularly, the machine-compatible representation may also be used for controlling a machining tool to machine a light-redirecting surface of an intermediate substrate further used for mass production of caustic layers by replication (such replicating may comprise one of roll-to-roll, foil-to-foil, UV casting, and embossing). Moreover, the method of designing the relief pattern may comprise a preliminary step of configuring the mask layer to show, upon the illumination of the optical element with the point-like source, a visible image reproducing a reference image distinct from the reference pattern.

The present invention will be described more fully hereinafter with reference to the accompanying drawings, in which prominent aspects and features of the invention are illustrated.

DETAILED DESCRIPTION

Figure 1:
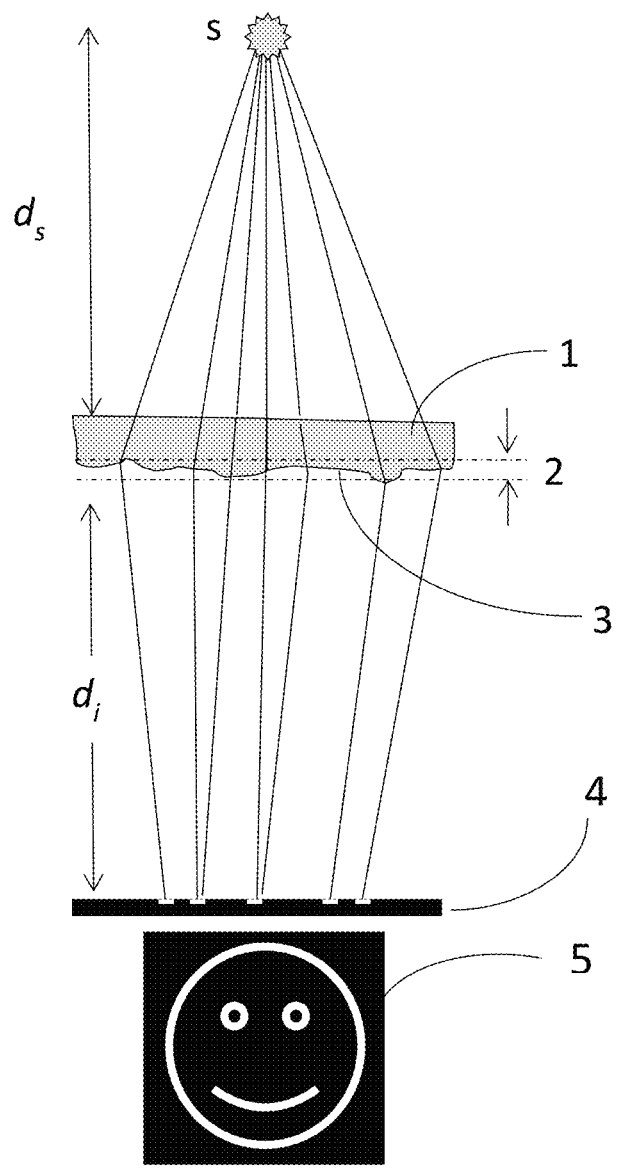
FIG. 1 illustrates an optical configuration of a refractive optical element for projecting a caustic pattern in a common case where there is no mask layer.

In optics, the term "caustic" refers to an envelope of light rays refracted or reflected by one or more surfaces, at least one of which is curved, as well as to projection of such light rays onto another surface. More specifically, a caustic is the curve or surface tangent to each light ray, defining a boundary of an envelope of rays as a curve of concentrated light. For example, the light pattern formed by sunrays at the bottom of a pool is a caustic "image" or pattern formed by a single light redirecting surface (the wavy air-water interface), whereas light passing through the curved surface of a water glass creates a cusp-like pattern on a table which the water glass is resting as it crosses two or more surfaces (e.g. air-glass, glass-water, air-water) which redirect its path.

In the following, the most common configuration where the (refractive) caustic layer of an optical element is bound by one (curved) surface, or light-redirecting surface, and one flat surface will be used as an example, without restricting the more general cases. It will be here referred to a more general "caustic pattern" (or "caustic image") as the light pattern formed onto a screen for example (projection surface) when a suitably shaped optical surface (with a light-redirecting surface having an appropriate relief pattern) of the caustic layer redirects light from a source to divert it from some regions of the screen, and concentrates it on other regions of the screen in a pre-determined light pattern (i.e. thus forming said "caustic pattern"). Redirection refers to the change of path of light rays from the source in the presence of the caustic layer with respect to the path from the source to the screen in the absence of the caustic layer. A caustic layer (refractive or reflective) is thus a piece of a first optical material having a light-redirecting surface with a relief pattern adapted to redirect light received from a light source to form a caustic image. An optical element according to the invention includes a caustic layer, and may further comprise additional optical element(s) (e.g. lens, or support substrate) participating to light redirection.

In turn, the light-redirecting optical surface will be referred to as "relief pattern", and the piece of first optical material that is bound by this surface will be referred to as caustic layer. It should be noted that the caustic pattern may be the result of redirection of light by more than one surface and more than one object, although possibly at the price of increased complexity. Moreover, a relief pattern for generating a caustic pattern must not be confused with a diffractive pattern (like, for example, in security holograms).

The concept of the present invention may be for example applied to common objects, such as consumer products, ID/credit cards, banknotes, and so on. To do so, it is required to drastically shrink down the size of an optical element, and in particular bring the relief depth of the relief pattern below acceptable values. To this aim, having an efficient workflow is particularly useful as it allows several design iterations until all operational constraints are met.

In this description under "relief" should be understood the existence of a height difference (as measured along an optical axis of the optical element) between the highest point and lowest point of a surface, in analogy with the difference of altitude between the bottom of a valley and the top of a mountain (i.e. as "peak to valley" scale). While the method according to the invention is not limited to a specific relief, for many of the applications contemplated the maximum depth of the relief pattern of the optical element is typically less or equal than 250 μm or more preferably less or equal than 30 μm, while being above the limit imposed by ultra-precision machining (UPM) and reproduction process, i.e. about 0.2 μm.

According to this description, the height difference between the highest and lowest point in the relief pattern on the light-redirecting surface is referred to as relief depth ε.

A caustic pattern (image), forming an approximation of a digital image, should be understood as a light pattern projected by an optical element, when illuminated by a suitable point-like source. As mentioned above, the optical element should be understood as the slab of refractive (or reflective) material responsible for creating the caustic pattern.

A light-redirecting surface(s) is the surface (or surfaces) of the caustic layer (of an optical element) responsible for redirecting the incoming light from a source onto a screen, or (preferably flat) projection surface, where the caustic pattern is formed.

A first optical material substrate, used to make a caustic layer of an optical element, is a raw material substrate from which a surface is specifically formed so as to have a relief pattern and thus to form a light-redirecting surface. In case of a reflective light-redirecting surface, the first optical material substrate is not necessarily homogeneous or transparent; the same applies into the case of a master surface only used for further replication. For example, the material may be opaque to visible light, and reflectivity may be obtained by classical metallization of the formed surface. In case of a refractive light-redirecting surface, the raw material substrate is transparent, or partially transparent, and homogeneous with a refractive index n (for photons of the spectrum visible to a human eye), and the corresponding light-redirecting surface is named as the "refractive transparent or partially transparent light-redirecting surface of refractive index n".

A master light-redirecting surface according to this description is the first physical realization of a light-redirecting surface from the calculated one. It can be replicated into several copies (tools) which are then used for mass replication.

A point-like source (see FIG. 1-2) as used in this description is a source of light S whose angular size (from the point of view of the optical element), is sufficiently small that light can be considered to arise from a single point at a distance $d_s$ from the light-redirecting surface. As a rule of thumb, this means that the quantity: (source diameter)×$d_i/d_s$, is smaller than the desired resolution (e.g. 0.05-0.1 mm) of the target caustic pattern on a projected image on a projection surface at a distance $d_i$ from the light-redirecting surface. The screen should be understood as a surface on which the caustic pattern is projected. The distance between source and the light-redirecting surface is also named as source distance $d_s$ and the distance between the light-redirecting surface and the screen is named as image distance $d_i$.

The term tool (or replication tool, when it is necessary to remove ambiguity) is mainly used for the physical object carrying the profile of a light-redirecting surface that is used for mass replication. It can be used for example to produce a copy of a master light-redirecting surface (the original relief being reproduced, by embossing or injection, from the master carrying the corresponding inverted relief). For the tool used to machine the relief pattern of the light-redirecting surface, the term machining tool is used to remove ambiguity.

FIG. 1 is a schematic illustration of typical optical configuration of a refractive optical element for projecting a caustic pattern reproducing a (meaningful) reference pattern. An optical element (1), made of a piece of refractive transparent or partially transparent first optical material, and including a caustic layer (2) having refractive surface (3), redirects light from a point-like source S and projects it onto a suitable screen (4), which can be any surface of any object, etc., where a recognizable (by an observer) caustic pattern (5) is formed. The image can be for example a logo, a picture, a number, or any other information that may be relevant in a specific context. Preferably, the screen is a flat projection surface or a flat part of any object. A special design of the light-redirecting surface (3) may allow projecting a (recognizable) caustic pattern on a curved surface.

The configuration of FIG. 1 shows that light received by the optical element (1) from the source S is redirected by a suitably shaped relief pattern of the light-redirecting surface (3) of the caustic layer (2). This general idea is for example known from reflective surfaces for car headlights, reflectors and lenses for LED illumination, optical systems in laser optics, projectors and cameras. However, usually, the goal is to transform a non-homogeneous distribution of light into a homogeneous one.

Figure 2:
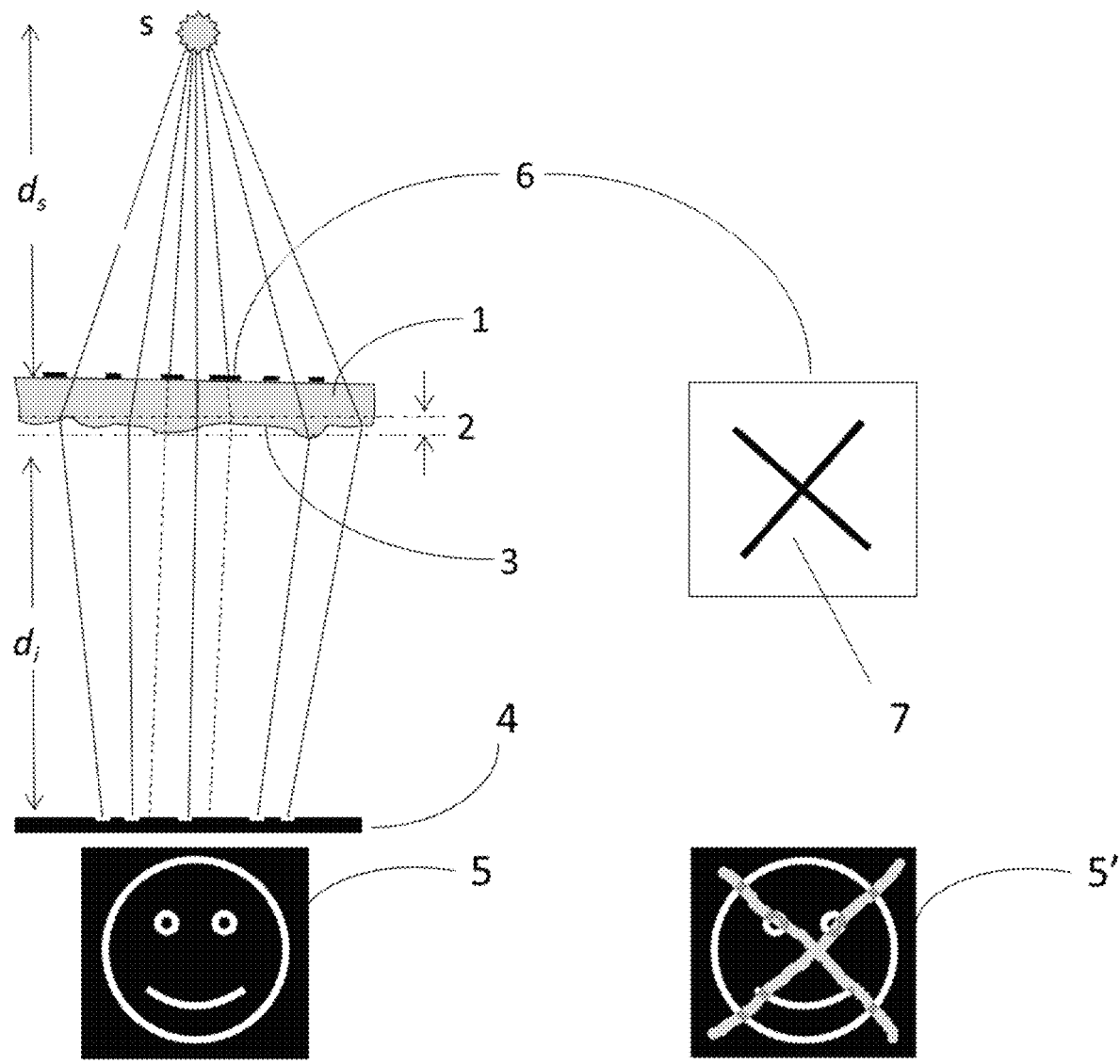
FIG. 2 illustrates an example, according to the invention, of an optical element for projecting a caustic pattern, wherein a mask layer is present and contributes to determining the projected pattern.

By contrast, a goal of the present invention, as illustrated on FIG. 2, is to obtain a non-homogeneous light pattern, i.e. a caustic pattern (5), which (approximately) reproduces some regions of relative brightness of a reference pattern (e.g. as represented on a digital image of the reference pattern) when the optical element (1) further includes a mask layer (6) with a mask pattern (7) that modifies a transmission through the optical element (1) of light received from the light source S (according to the mask pattern). Thus, the relief pattern of the light-redirecting surface (3) must be specifically adapted to the mask pattern transmission properties in order to provide the visible caustic pattern (5) of which caustics reproduce (approximately) the given reference pattern. The optical material forming the mask pattern (7) of the mask layer (6) can be opaque (i.e. does not transmit light) or more or less transparent to visible light emitted by the light source S. Of course, in case the optical material of the mask pattern (7) is opaque, the mask layer (6) must comprise a non-opaque portion that can transmit light according to a (non-zero) optical transmission coefficient. Regarding light transmission, the mask layer (6) can thus be characterized by a variable light transmission coefficient t which may vary locally from zero (in case incident light is blocked by an opaque portion of the mask pattern) to one (in case of full transmission of incident light through an unmasked portion of the caustic layer). Intermediate local values of the transmission coefficient 0<t<1 are possible in case the corresponding local portion of the mask pattern (7) is partially transparent. The mask layer (6) may be a layer of some specific optical material. The mask layer (6) may have a constant thickness while comprising two distinct portions with materials having different transmission coefficients and abutting according to a contour of the mask pattern (7). However, the mask layer may only merely result from a (local) modification (forming the mask pattern) of the light transmission property of the optical material of the optical element itself, or the mask pattern may result from a local modification of the optical transmission properties of the first optical material of the mask layer: for example, by locally sandblasting a surface of the piece of first optical material so as to locally modify its transmission coefficient t according to the mask pattern. The mask layer (6) may be disposed on an entry optical surface (with respect to incoming light from the source S) of the optical element (1), or on another optical surface, or within the optical element itself (i.e. as an internal layer), or on the light-redirecting surface (3) (see FIG. 2): in the latter case, the mask layer (6) can further protect the light-redirecting surface (3) (to prevent wear for example). In the example illustrated on FIG. 2, the mask layer (6) is disposed on the entry face of the optical element (1), the mask pattern (7) has a shape of a cross (i.e. an "X") and the thin relief pattern of the light-redirecting surface (3) of the caustic layer (2) has been calculated so as to provide a projected caustic pattern (5) on the screen (4) representing a symbolic visage without cross that can be easily identified by an observer as reproducing a (known) reference pattern. Moreover, in case the mask layer is missing (e.g. removed, or in case of a counterfeited relief pattern of the caustic layer), the relief pattern then projects a (modified) caustic pattern (5') representing the symbolic visage crossed out by a cross X. In this case, an observer can easily detect that the optical element in not a genuine one, as the visible caustic pattern does not reproduce the right reference pattern.

Preferably (see FIG. 3-4), the mask pattern (7) comprises a visible image (8), reproducing a reference image (e.g. a portrait, a logo etc.), that can be seen by an observer looking at the mask layer (6), particularly when the source S illuminates the optical element (1). More preferably, the visible image (8) does not look like the visible caustic pattern (5), thus provoking an effect of surprise to an observer looking at the illuminated mask layer (6) and the projected caustic pattern (5).

An advantage of the invention is thus that the optical element equipped with a mask layer (6) can hardly be counterfeited. For example, in case the mask layer (6) of a genuine optical element is disposed on the entry face of said optical element (1) (i.e. on the surface of the optical element that first receives light emitted by the source S, as illustrated on FIG. 2), or within the piece of refractive transparent or partially transparent material of the optical element, a counterfeiter willing to make an optical element capable to provide a visible caustic pattern consistent with the reference pattern by reproducing the relief pattern of genuine caustic layer (3) (e.g. by making a cast of the relief pattern to obtain a mould for reproducing an optical element), but without disposing very precisely the corresponding mask pattern (i.e. in register with the relief pattern) or without providing the mask layer, will not obtain the desired visible caustic pattern that convincingly reproduces the right reference pattern. Thus, even in case of an optical element of which mask layer has not been designed to display a specific visible image, if the illuminated relief pattern (3) together with its mask layer (6) allow forming a caustic pattern (5) on the screen (4) reproducing with sufficient quality (possibly differing by an overall intensity scaling factor) a known reference pattern, then a person merely visually observing the caustic pattern on the screen will easily see whether it constitutes or not a valid reproduction of the reference pattern and, in case the caustic pattern is similar enough to the reference pattern, will consider that the optical element, or an object marked with said optical element, is (with strong likelihood) genuine.

Figure 3A:
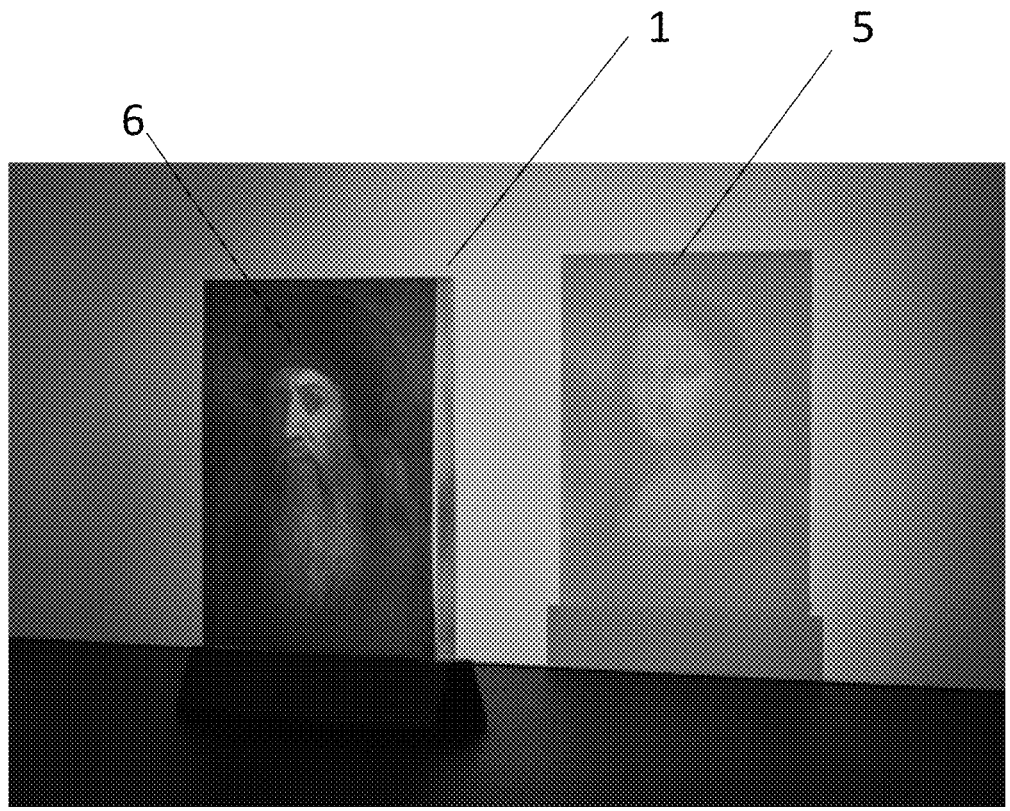
FIG. 3A shows an optical element with combined mask layer and caustic layer according to the invention, the mask layer having a reference image (Leonardo's portrait) different from the projected image (caustic pattern of the Gioconda).
Figure 3B:
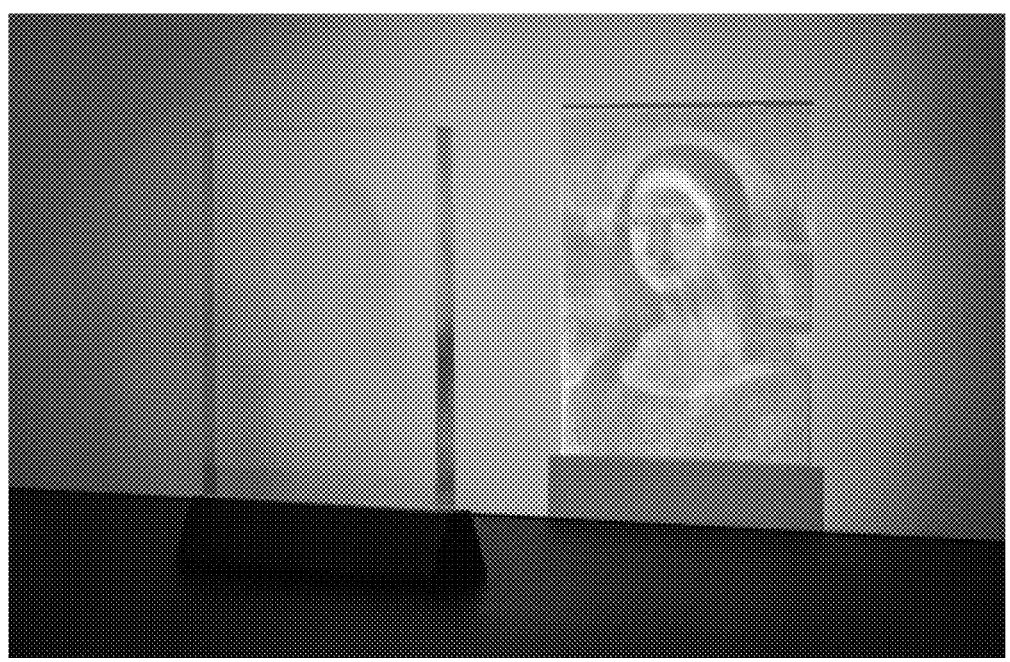
FIG. 3B corresponds to the optical element of FIG. 3A, when the mask layer is removed: with distortions and spurious features visible on the projected image.
Figure 3C:
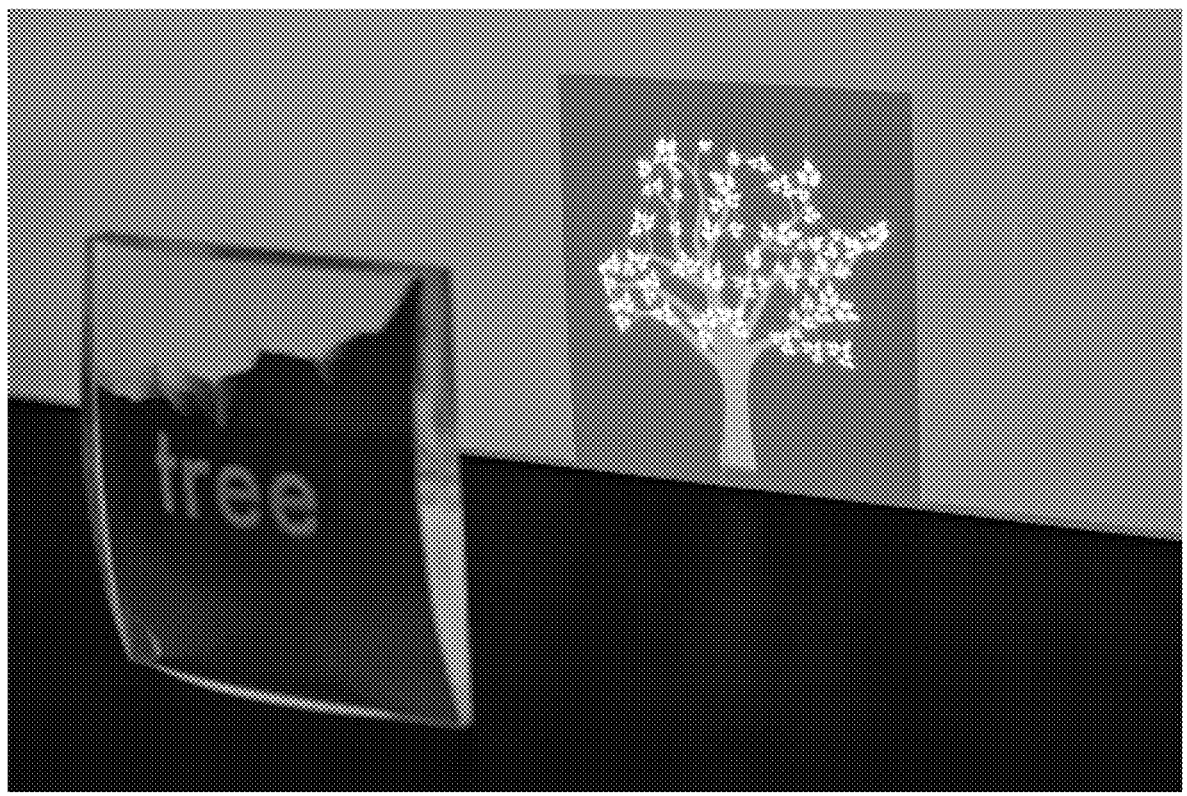
FIG. 3C shows an optical element according to the invention, with a mask layer having a reference image "tree" different from the projected image (of a tree), the optical element being formed on a transparent PMMA bloc.
Figure 4A:
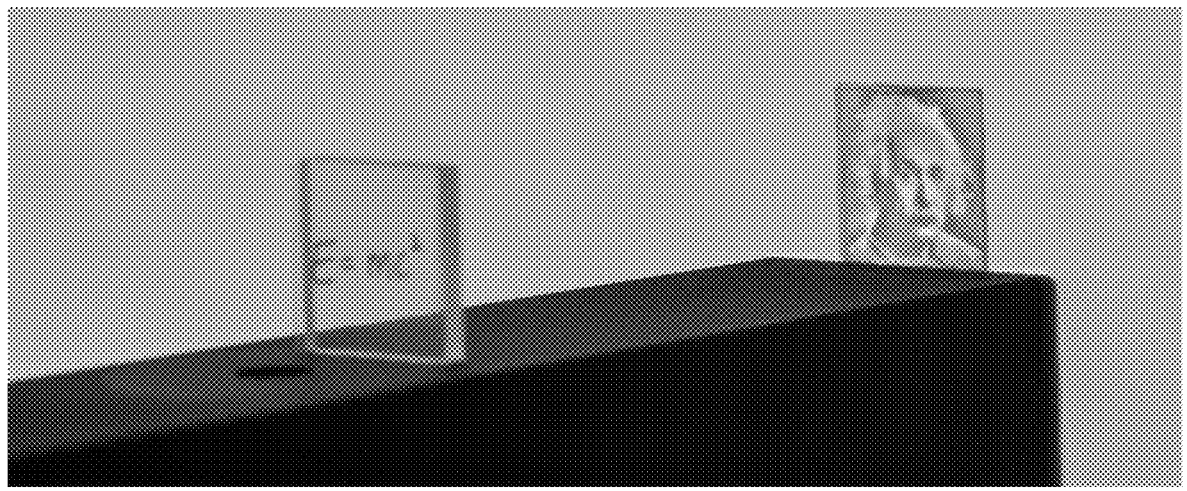
FIG. 4A illustrates an optical element with combined mask layer and caustic layer according to the invention, the mask layer having a reference image "E=m c$^2$" different from the projected image (caustic pattern of an Einstein's portrait).
Figure 4B:
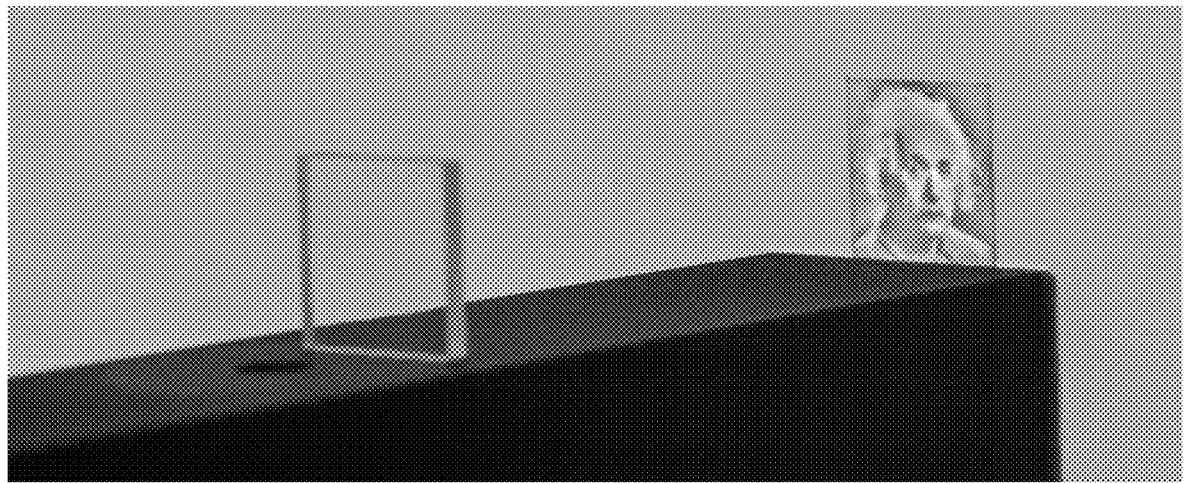
FIG. 4B corresponds to the optical element of FIG. 4A, when the mask layer is removed: with distortions and spurious features visible on the projected image.

FIGS. 3A-B and 4A-B illustrate the effect of removing a mask layer with a reproduction of a reference image from an optical element of which relief pattern of its caustic layer has been machined according to a design considering the presence of the mask layer. The mask layer of these examples has been applied on the surface of the optical element so as to be easily removable. FIGS. 3B and 4B also illustrate a case of a copy of an optical element, and particularly of its light-redirecting surface, by a counterfeiter having not reproduced the corresponding mask layer. FIG. 3A shows an optical element (1) illuminated by a source, with a mask layer (6) disposed on its entry face and representing a well-known portrait (reference image) of Leonardo da Vinci, while the relief pattern of the caustic layer (on the back of the optical element, not shown) adapted to the mask layer projects a visible caustic pattern (5) representing the well-known portrait of the Gioconda (reference pattern). An observer looking at the displayed visible image and the projected caustic pattern can easily authenticate the optical element (or an object marked with such optical element) by visually evaluating that the visible image is indeed similar to the reference image, and the projected caustic pattern is indeed similar to the reference pattern. However, in case the mask layer is removed from the entry face of the optical element, as shown on FIG. 3B, of course there is no visible image of the reference image, but also the projected visible pattern now shows a clearly degraded representation of the reference pattern. In this latter case, an observer will at least clearly detect that the projected caustic pattern is not similar to the reference pattern. FIG. 3C corresponds to an optical element formed on a transparent PMMA block of 100×100× 20 mm which has been machined by CNC milling with a hemispherical diamond tool to obtain a projected image of a tree (upon illumination), and with a mask pattern area corresponding to the word "tree" formed by etching with a very small tool to obtain a frosted effect which therefore blocks the light only in this area. Thus, the result is an entry face with a clearly readable word "tree" on it, while the projected image shows a tree (when illuminated).

FIG. 4A illustrates another striking example with a mask pattern of the mask layer representing a famous Einstein's formula $E=m\,c^2$ (reference image), while the relief pattern of the corresponding caustic layer is adapted to project a well-known portrait of Albert Einstein (reference pattern): in case the mask layer is removed, no visible image appears upon illumination of the entry face of the optical element and the projected caustic pattern now shows the portrait of A. Einstein, but distinctly crossed out with a caustic pattern of the formula $E=m\,c^2$. Here too, an observer can easily detect whether the mask layer is missing or not, and whether the image on the entry face and the projected caustic pattern are respectively visually similar to the reference image and reference pattern.

According to the embodiment of FIG. 2 light rays from the (point-like) light source S propagate to the refractive optical element (1) at a source distance $d_s$ with a light-redirecting surface (3) having a relief pattern. The optical element is here made of a transparent or partially transparent homogeneous material of refractive index n. The caustic pattern (5) is projected on the screen (4) at an image distance $d_i$ from the light-redirecting surface (3) of the optical element (1). Authenticity of the optical element (and thus, that of an object marked with this element) can be evaluated directly by an observer visually checking a degree of resemblance between the projected caustic pattern (5) and the known reference pattern.

Preferably, the relief pattern (3) is calculated starting from a specified target digital image of the reference pattern. From that calculated relief pattern, a corresponding physical relief pattern can be created on a surface of suitable optical material substrate, i.e. a transparent or partially transparent material of refractive index n (or a reflective surface of opaque material in case of a reflective optical element), using for example Ultra Precision Machining (UPM) or Grey-scale lithography. In case of machining a relief on a surface of an opaque optical material substrate to form a reflective surface, a good reflectivity will be obtained either by the suitable properties of the material itself, or by a further conventional operation of depositing a thin layer of metal (metallizing) on the relief. UPM uses diamond machining tools and nanotechnology tools to achieve very high accuracy so that the tolerances can reach "sub-micron" level or even nano-scale level. In contrast to this, "High Precision" in traditional machining refers to tolerances of microns in the single-digits. Other potentially suitable techniques to create a physical relief pattern on a surface are laser ablation, and grayscale lithography. As known in the domain of micro-fabrication, each of these techniques has different strengths and limitations, in terms of cost, precision, speed, resolution, etc.

A suitable optical material substrate for a refractive light-redirecting optical element should be optically clear, transparent or at least partially transparent, and mechanically stable. Typically, a transmittance T≥50% is preferred, and T≥90% is most preferred. Also, a low haze H≤10% can be used, but H≤3% is preferred and H≤1% is most preferred. The optical material should also behave correctly during the machining process, so as to give a smooth and defect-free surface. An example of a suitable substrate is an optically transparent slab of PMMA (also known under the commercial names of Plexiglas, Lucite, Perspex, etc.). For reflective caustic light-redirecting optical elements, a suitable optical material substrate should be mechanically stable, and it should be possible to give it a mirror-like finish. An example of a suitable substrate is a metal, such as those used for masters of ruled gratings, and laser mirrors, or a non-reflective substrate which can be further metallized.

For large scale production, further steps of tool creation and mass replication of the optical element on a target object are required. A suitable process for tool creation from a master is, e.g. electroforming. Suitable processes for mass replication are, e.g. hot embossing of a polymer film, or UV casting of a photo-polymer, and these can be further implemented either in a roll-to-roll or a foil-to-foil process. For the purpose of mass replication, neither the master nor the tool derived from it need to be optically transparent, hence opaque materials (notably, metals) can also be used even when the final product is a refractive optical element. Nevertheless, in some cases it might be advantageous that the master is transparent, as it allows checking the quality of the caustic image before proceeding with tooling and mass replication.

A critical aspect for the use of an optical element with light-redirecting surface having relief pattern and mask layer as security features is its physical scale, which must be compatible with the target object to be marked, and the optical configuration required to project the caustic image.

In general, the maximum lateral size of the optical element is limited by the overall size of the object and may usually range from a few cm to less than 1 cm in less favorable cases. For certain uses, like for example for banknotes, the targeted overall thickness can be extremely small (of the order of 100 µm or less). Furthermore, admissible thickness variations (relief) are even smaller, for a variety of reasons, including mechanical constraints (weak spots associated with the thinner areas) and operational considerations (e.g. when stacking-up banknotes, the pile will bulge corresponding to the thicker portion of the bill, which complicates handling and storage). Typically, for a banknote of overall thickness of about 100 µm, a target thickness for the relief pattern of an optical element to be included in this banknote may be of about 30 μm. For a credit card or an ID card of about 1 mm thickness, a target thickness for the relief pattern of an optical element to be included in this credit/ID card will be less than about 400 μm and preferably no more than about 250 μm.

Furthermore, the source- and image-distance, are generally limited by user comfort to a few tens of centimeters. Notable exceptions are the sun or a spot light mounted on the ceiling, which however are less readily available under certain circumstances. Also, the ratio $d_s/d_i$ between the two distances is typically larger than 5 to 10, so as to obtain a sharper image (and with good contrast) that is easier to recognize. Moreover, the ratio $d_s/d_i \geq 5$ together with a light source S being preferably point-like (e.g. illumination LED of a conventional mobile phone) allows considering that the light source is in fact approximately "at infinity" and thus, a projection surface at only approximately the focal distance from the optical element will be suitable for a clear viewing of a projected caustic pattern. As a consequence, the conditions of good visual observation by a user do not require a too strict relative spatial arrangement of the light source, the optical element and the user's eyes.

Although only the configuration for a transmissive caustic optical element is described here, the same reasoning can be applied to a reflective configuration, with only minor changes (particularly, concerning the application of Fermat's principle).

Figure 5:
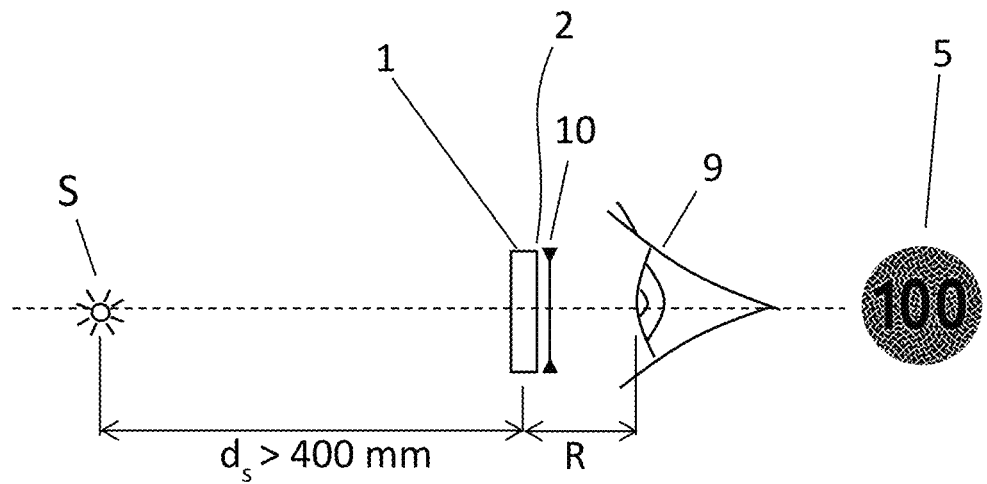
FIG. 5 illustrates an optical element being a see-through element according to the invention with combined mask layer and caustic layer for projecting a caustic pattern directly on a retina of an observer, with a lens element having a negative focal length and a caustic layer with a positive focal length.
Figure 6:
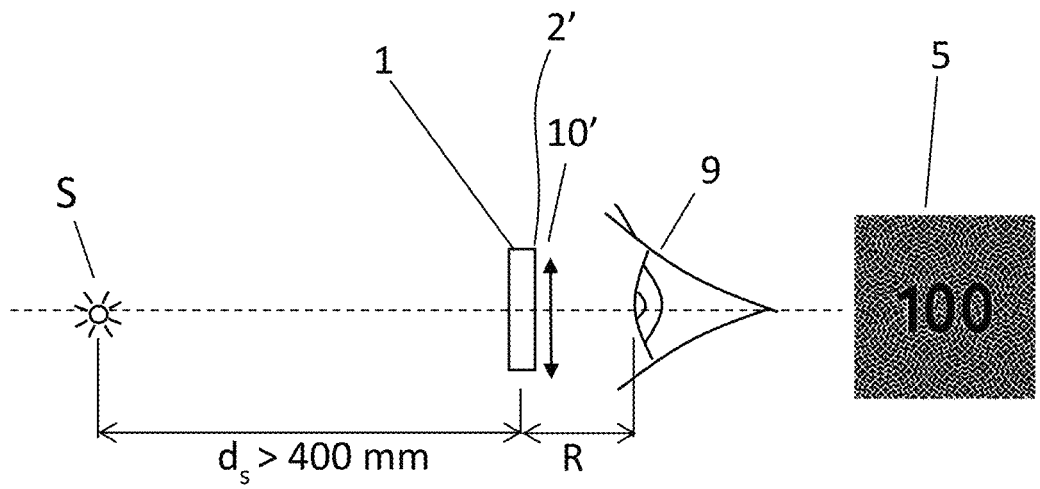
FIG. 6 illustrates another optical element being a see-through element according to the invention with combined mask layer and caustic layer for projecting a caustic pattern directly on a retina of an observer, with a lens element having a positive focal length and a caustic layer with a negative focal length.

According to a variant of the invention, the (refractive) optical element can be a see-through element, as illustrated on FIGS. 5-6, with a caustic layer having a light-redirecting surface with a relief pattern of given depth and a focal length $f_C$ and an adjacent lens element of focal length $f_L$ configured to redirect incident light received from a point-like light source through it and form a projected caustic pattern directly on a retina of an observer looking at the point-like source through the optical element. Preferably, the optical element comprises one of the following:

a) the caustic layer has a positive focal length ($f_C>0$) and the lens element has a negative focal length ($f_L<0$), as shown on FIG. 5, or
b) the caustic layer has a negative focal length ($f_C<0$) and the lens element has a positive focal length ($f_L>0$), as shown on FIG. 6.

In the example illustrated on FIG. 5 the optical element has a mask layer (6) disposed on the entry face, and in order to see a projected caustic pattern (5) with the eye (9) upon illumination by the light source S, the caustic layer (2) has a peak to valley height Δh=30 μm and a focal length of 40 mm and is combined with a negative lens element (10) inserted next to it. The light source S is located at the distance of at least 400 mm from the caustic layer (2). The setup is held in front of the eye (9), at a distance of about 20-30 mm, which is regarded as the eye-relief distance R. A caustic image (5) on the retina is also shown. The beams exiting the optical element are divergent and thus, the eye iris limits the field of view and the portion of the caustic image that is seen. The closer the optical element to the eye, the larger is the field-of-view and the larger is the portion of the caustic image that is seen.

In the example illustrated on FIG. 6 the optical element has also a mask layer (6) disposed on the entry face, the caustic layer (2)' has a light-redirecting surface which is a negative copy of the original element used in FIG. 5 and thus has negative focal length of −40 mm. It is combined with positive lens element (10') and is held similarly to the setup in FIG. 5 at distance R from the eye (9). The light source S is also located at the distance of at least 400 mm from the caustic element (2'). A corresponding caustic pattern (5) is created on the retina of the eye. As shown on the figure a larger portion of the caustic pattern is seen compared to that in FIG. 5 as the rays at the exit of the optical element are convergent and the eye iris is clipping less rays before reaching the retina.

Figure 7:
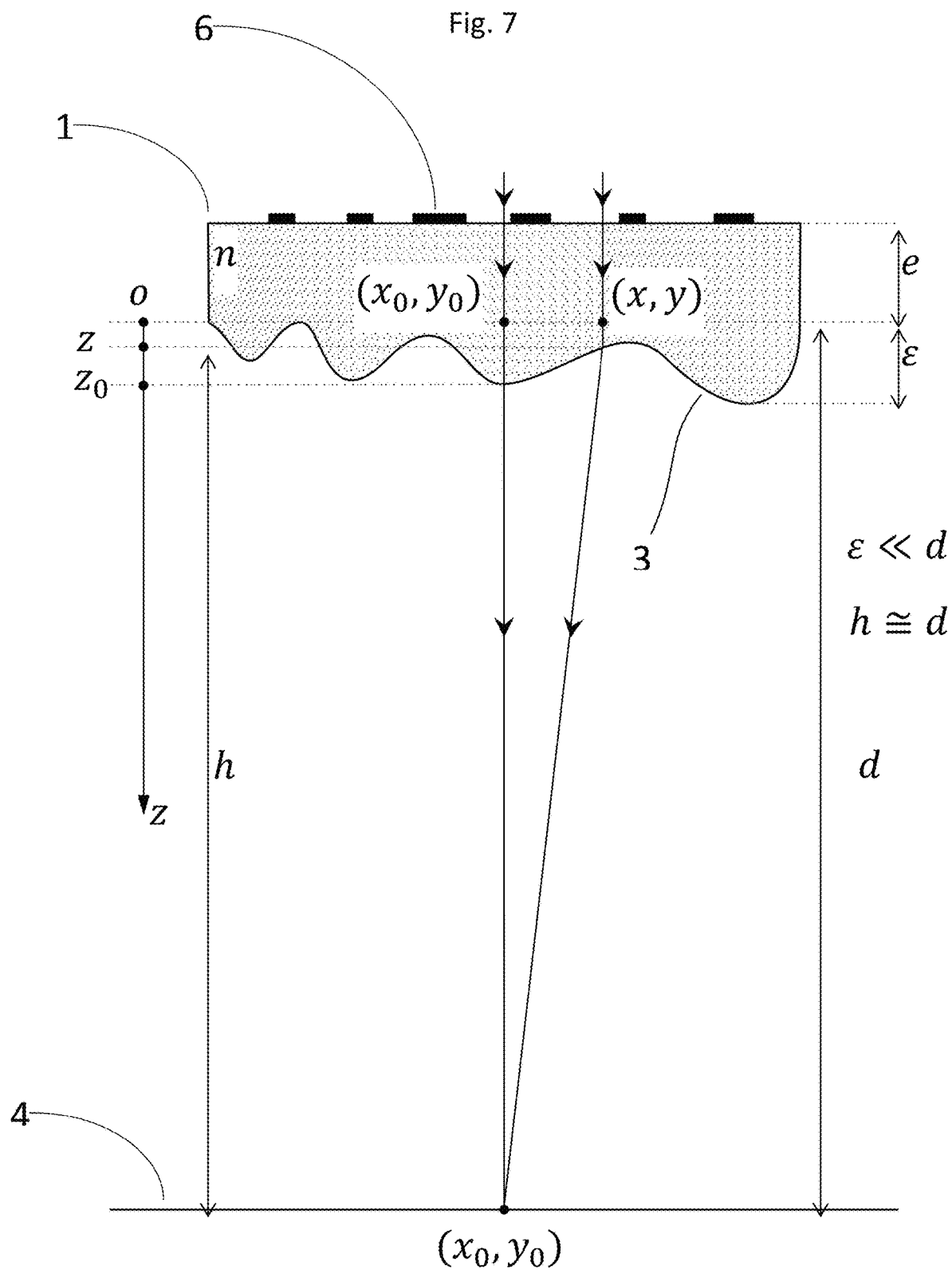
FIG. 7 illustrates a detailed view of the refractive optical element of FIG. 2.

For the purpose of description, it is convenient to define a Cartesian reference frame, with the z axis aligned with the optical axis of the optical element and pointing from the source to the image, and a plane (x, y) perpendicular to the optical axis. In order to illustrate the concept of the invention a simple optical element of "plano-convex" type is considered (FIG. 2 and FIG. 7) and is illuminated with a beam of (substantially) parallel rays, wherein a mask layer is disposed within or on the first optical material of the caustic layer. FIG. 7 shows a detailed view of the example of FIG. 2 in which the mask layer (6) is applied on the entry face of the plano-convex optical element (1) and the mask pattern (7) has a shape of an "X". The mask layer (6) extends substantially perpendicular to the optical axis, with a shape according to a given mask pattern which allows the mask layer to block or at least reduce light transmission of incident rays through some part(s) of the caustic layer (2) while letting incident rays go through other part(s) of the caustic layer. Extension to the case of a light source at finite distance being straightforward by the addition of a lens-like element, transforming the finite-distance source into a virtual source at infinity. The function of the lens-like element may eventually be incorporated directly into the caustic optical element. The x and y axes thus lie on the plane of the optical element (that is parallel to the entry face of the optical element). The caustic surface corresponding to the relief pattern of the light-redirecting surface (3) is mathematically described by a scalar function z=F(x,y), giving the distance z of the surface from a reference plane z=0 at a point of coordinates (x,y) of the optical element. For the purpose of convenience in the subsequent description, this plane can be located at the back surface of the optical element (1), in which case z=F(x,y) is equal to the thickness of the optical element (see FIG. 7). In the example shown on FIG. 7, this plane is parallel to the plane of the caustic pattern.

Likewise, the caustic pattern is described by a scalar function I(x',y'), giving the luminous intensity at a point (or pixel) of coordinates (x',y') on the image plane on the screen (4).

It should be noted that the use of Cartesian coordinates is a matter of convenience, and other systems may also be used instead (e.g. in the case where the caustic surface is part of or supported by a curved object). Likewise, the back surface of the optical element need not be flat, although obviously this must be kept into account in the calculations.

Embodiments of the present invention utilize the property that light travels along paths of stationary optical length, where the optical path length is a local extremum with respect to any small variation in the path (i.e. the Fermat's principle). For any given point $(x_0,y_0)$ of the caustic pattern, a bundle of rays of small cross-section converging on it have traveled paths of the same optical length. Typically, a relief pattern of a light redirecting surface (3) of a caustic layer (2) has a relief depth ε very small compared to the distance d between the caustic layer and the image plane on which the caustic image is formed (see FIG. 7): indeed, generally a resulting value of ε is less than 300 μm while d is greater than 5 cm (thus, $\varepsilon/d < 6 \cdot 10^{-3}$), the relief depth ε being defined as the height difference between the highest and the lowest point of the relief pattern. The overall thickness of the caustic layer (2) is (e+ε) where e is the thickness of the homogeneous part of the optical material of the caustic layer. Generally, the thickness e is also very small compared to the observation distance d, i.e. typically e is less than a millimeter (thus, $e/d \leq 2 \cdot 10^{-2}$, and $(e+\varepsilon)/d \leq 2.6 \cdot 10^{-2}$). However, the layer of thickness e, corresponding to a propagation of incoming light rays within the caustic layer as mere parallel rays, has no effect regarding a difference of optical path and thus will be disregarded. Considering the caustic layer (2) illustrated on FIG. 7, for a light source S located at infinity (for simplicity, so that we have parallel incoming rays; however, extension to the case of a light source at finite distance is straightforward by merely considering an optical lens transforming the finite-distance source into a virtual source at infinity), ($s_i=\infty, d_i=d$), we consider a difference of optical path length $\Delta l$ between:

(i) an optical path length $l(x_0, y_0)$ of a straight ray entering the plane face (at level z=0) of the caustic layer (2), at point $(x_0, y_0)$, passing through the caustic layer in the first optical material of refractive index n up to the point $(x_0, y_0)$ at level $z_0$ of the light-redirecting surface of equation z=F(x,y), and reaching the focus point $(x_0, y_0)$ of the image plane on the screen (4), and (ii) an optical path length l(x,y) of a ray entering the plane face (at level z=0) of the caustic layer, at point (x,y) close to the point $(x_0, y_0)$, passing through the caustic layer up to the point (x,y) at level z of the light-redirecting surface, and deflected to the point $(x_0, y_0)$ of the image plane.

If r is the distance between the points $(x_0, y_0)$ and (x,y), i.e. $r=\sqrt{(x-x_0)^2+(y-y_0)^2}$, we have:

$$\Delta l = l(x_0,y_0) - l(x,y) = n(z_0 - z) + (d - z_0) - \sqrt{r^2 + (d-z)^2}.$$

According to the Fermat's principle, we must have $\Delta l=0$, and thus, solving the quadratic equation in z, we obtain:

$$\frac{z_0 - z}{d - z_0} = \frac{1}{n+1}\left(\sqrt{1 + \frac{r^2}{(d-z_0)^2}\frac{n+1}{n-1}} - 1\right).$$

wherein, in view of $\varepsilon \ll d$, we have $d - z_0 \approx d$. Hence, said $z=f_0(x,y)$ designating a local representation of the surface z=F(x,y) (i.e. around the point $(x_0, y_0)$), and $z_0=f_0(x_0, y_0)$ being the quote at the vertex, we can write:

$$z = f_0(x, y) = f_0(x_0, y_0) + \frac{d}{n+1}\left[1 - \sqrt{1 + \frac{n+1}{n-1}\left(\frac{r}{d}\right)^2}\right],$$

which represents a surface of revolution around the z axis with a vertex at point $(x_0, y_0, z_0)$.

Consequently, if instead of the focus point $(x_0, y_0)$ we consider any one of the focus points $(x_i, y_i)$ on the image plane (i=1, ..., N), we can define a local (i.e. with vertex at point $(x_i, y_i)$) approximation of F(x,y) by:

$$z = f_i(x, y) = f_i(x_i, y_i) + \frac{d}{n+1}\left[1 - \sqrt{1 + \frac{n+1}{n-1}\left(\frac{r_i}{d}\right)^2}\right],$$

wherein $z_i = f_i(x_i, y_i)$, and $r_i = \sqrt{(x-x_i)^2+(y-y_i)^2}$. Hence, the function F(x,y), giving the overall shape of the light-redirection surface (3) of the caustic layer (2), can be locally represented, consistently with the above mentioned stationarity of the optical path, by a piecewise surface being the envelope resulting from the intersections of pieces of surfaces having "elementary shape functions" $z=f_i(x,y)$ around vertices $(x_i, y_i)$ corresponding to given points $(x_i, y_i)$, i=1, ..., N, on the image plane (on screen (4)).

The invention further takes advantage from the observation that, in the paraxial approximation, i.e. with r<<d, and thus with $$\delta_i = \left(\frac{r_i}{d}\right)^2 \ll 1,$$

this local representation of the caustic surface can be further approximated in a vicinity of $(x_i, y_i)$ with the first few non-zero terms of the Taylor expansion of the expression within the square brackets:

$$1 - \sqrt{1 + \frac{n+1}{n-1}\delta_i^2} \approx -\frac{n+1}{2(n-1)}\delta_i^2 + \frac{(n+1)^2}{8(n-1)^2}\delta_i^4 + \ldots.$$

Figure 8:
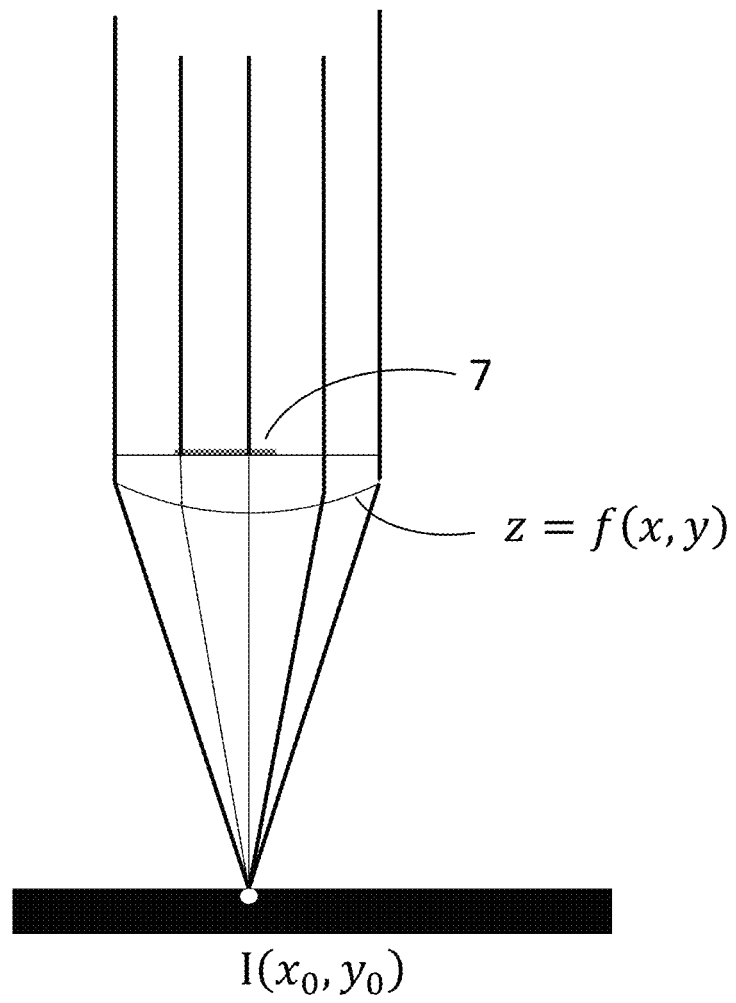
FIG. 8 shows parallel rays illuminating with uniform intensity a portion of the entry face of the caustic layer covered by a portion of the mask pattern, and forming an image point.

For example, if we consider the local approximation $f_i(x,y)$ of F(x,y) around a point $(x_i, y_i)$ and account only for the first non-zero term of the Taylor expansion, we obtain the simplified approximation of the local representation:

$$f_i(x, y) \approx f_i(x_i, y_i) - \frac{d}{2(n-1)}\left(\frac{r_i}{d}\right)^2,$$

which describes a paraboloid of revolution with axis centered at $(x_0, y_0)$, as shown in FIG. 8, with a "height" $z_i=f_i(x_i, y_i)$ with respect to the (x,y) plane at z=0 and corresponding to the vertex of the paraboloid (of spatial coordinates $(x_i, y_i, z_i)$). For a Taylor expansion to the next non-zero order (k=4), we obtain the approximation of the local representation around a point $(x_i, y_i)$ as:

$$z = f_i(x, y) \approx f_i(x_i, y_i) - \frac{d}{2(n-1)}\left(\frac{r_i}{d}\right)^2 + \frac{d(n+1)}{8(n-1)^2}\left(\frac{r_i}{d}\right)^4.$$

When considering the piecewise paraboloid approximation of F(x,y) given by the approximation up to the first non-zero order of the local representation $f_i(x,y)$, the intersection of two such (circular) paraboloids having respectively height $z_i$ above a point $(x_i, y_i)$ and height $z_j$ above an adjacent point $(x_j, y_j)$ generally defines a parabola in a plane perpendicular to the straight line joining the two points $(x_i, y_i)$ and $(x_j, y_j)$. Thus, for a set of points $\{(x_i, y_i), i=1, \ldots, N\}$ of the image plane, and a corresponding set of heights $\{z_i, i=1, \ldots, N\}$, of the vertices of the paraboloids respectively associated with said points, the resulting (outer) envelope of the intersection of these paraboloids (defining a piecewise light-redirecting surface) is formed of portions of paraboloids bounded by sharp parabolic curves. These curves can be calculated by solving mere algebraic equations of order two. In case of a Taylor expansion of order k=4 or higher, the corresponding "elementary shape functions" $z=f_i(x,y)$ are more complex than mere paraboloids and the calculation of the lines of intersection of the pieces of surfaces (when setting different heights of their vertices) becomes more laborious.

Figure 9:
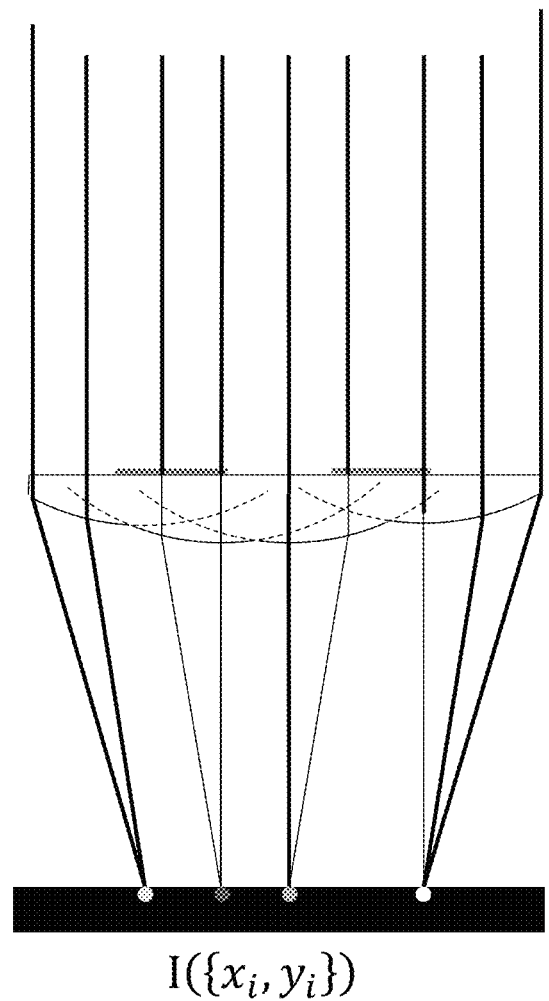
FIG. 9 shows parallel rays illuminating with uniform intensity a portion of the entry face of the caustic layer covered by a portion of the mask pattern, with a piecewise approximation of the light redirecting surface, and forming a plurality of image points.

In the example shown on FIG. 8, the incoming parallel rays illuminate the plane (entry) face z=0 of the caustic layer with an effective non-uniform light intensity $I_M(x,y)=I_0 t(x,$ y), where $I_0$ is an incident uniform light intensity, due to the presence of the mask pattern having a (local) light transmission coefficient t(x,y), and thus, for a given piecewise approximation of the light redirecting surface z=F(x,y), i.e. for a given set of N vertices $(x_i,y_i,z_i)$ and corresponding elementary shape functions $f_i(x,y)$, i=1, . . . , N, the contribution to intensity I(j) at point $(x_j,y_j)$ of the image plane from the envelope of the intersections of the elementary pieces of surface, as illustrated on FIG. 9, can be mathematically described by:

$$I(j) = \int\int I_0 t(x, y) \prod_{i=1, i\neq j}^{N} H[f_j(x, y) - f_i(x, y)] dx dy,$$

using the "trace function" (i,j belong to {1, . . . , N}):

$$\prod_{i=1, i\neq j}^{N} H[f_j(x, y) - f_i(x, y)],$$

wherein the function H[X] is the well-known Heaviside step function defined by $$H(X) = \begin{cases} 0, & X < 0 \\ 1, & X \geq 0 \end{cases}$$

and where the integrals are taken over the supporting domain of the caustic element (i.e. "window" or light collection area). Notice that there are, in principle, no specific limitations to the shape and/or size of the window. However, simple geometrical shapes, compact shapes, and convex shapes are advantageous for computational and practical purposes.

The expression of the piecewise approximation (for a given number N of image points $(x_i,y_i)$, i=1, . . . , N) of the representation of the caustic surface z=F(x,y) is thus given by:

$$F(x, y) \sim \sum_{j=1}^{N} f_j(x, y) \prod_{i=1, i\neq j}^{N} H[f_j(x, y) - f_i(x, y)].$$

Once a piecewise approximation of the light-redirecting surface z=F(x,y) is obtained (for a given set of N vertices), it is necessary to estimate the corresponding distribution of light intensity I(i), i=1, . . . , N at the selected respective points $(x_i,y_i)$, i=1, . . . , N, of the image plane, and estimate the difference for each target point $(x_i,y_i)$ between I(i) and the given (target) intensity $I_i$ at same point corresponding to the target caustic pattern to be reproduced. Thus, the heights $z_i$, i=1, . . . , N of the vertices are iteratively set so that the sum $$S = \sum_{i=1}^{N} |I(i) - I_i|^2$$

is minimized.

For example, in case the local pieces of surfaces $f_j(x,y)$ are approximated by the main term of the Taylor expansion, i.e. by paraboloids, a nonzero intensity I(j) at point $(x_j,y_j)$ on the image plane only comes from what remains of the paraboloid of vertex $(x_j,y_j,z_j)$, i.e. paraboloid (j), after intersection with the remaining paraboloids forming the piecewise surface F having respective vertices $(x_i,y_i,z_i)$, i≠j, i∈ {1, . . . , N} (and possibly with the border of the caustic layer window). In case the paraboloid (j) is fully masked by at least one paraboloid (i) (i.e. if $z_i$ is large enough with respect to $z_j$), the intensity I(j) is zero. As mentioned above, the contour of intersection of two paraboloids (i) and (j) is a parabola in a plane perpendicular to the straight line joining the two points $(x_i, y_i)$ and $(x_j,y_j)$, this plane being parallel to the optical axis along z: the intersection of this plane with the (x,y) plane at z=0 defines a straight segment. When considering the intersections of the paraboloid (j) with the neighboring paraboloids (i), the corresponding straight segments on the plane z=0 delineate a convex polygonal cell $\Omega_j$. Clearly, the light intensity I(j) delivered at point $(x_j, y_j)$ of the image plane only results from the incoming (uniform) parallel rays passing through the mask layer (which weights the light flux density due to the local transmission coefficient t(x,y)) and collected by the cell $\Omega_j$ and thus, the delivered light intensity I(j) is proportional to the weighted area a(j) of cell $\Omega_j$, i.e. the area weighted by the local mean value of the transmission coefficient of the mask layer over the cell $\Omega_j$ (corresponding to an effective weight $p_j = \oiint_{\Omega_j} t(x,y)dxdy$). Of course, the sum of all the weighted areas of the cells associated with the envelope of all the intersecting paraboloids must be equal to the full "effective" area A (on plane z=0), i.e. the area of the window weighted by the mask transmission:

$$\sum_{i=1}^{N} a(i) = A.$$

This constraint is accounted for by choosing an appropriate normalization while (iteratively) minimizing the sum $$S = \sum_{i=1}^{N} |I(i) - I_i|^2.$$

Each time the relative differences between heights of the vertices of the paraboloids are modified (by increasing or decreasing at least one of the N heights), the areas of the cells are modified accordingly: changing the heights of the vertices is thus equivalent to changing the areas of the cells. If the heights $z_i$ and $z_j$ of the respective vertices of the two paraboloids corresponding to two adjacent points $(x_i,y_i)$ and $(x_j,y_j)$ are modified, for example, by changing $z_j$ into $z_j+\delta z_j$ (the other heights being unchanged), the segment of boundary between the cell $\Omega_i$ (relating to the paraboloid (i)) and the cell $\Omega_j$ (relating to the paraboloid (j)) will move toward cell $\Omega_i$ if $\delta z_j$ is positive (i.e. weighted area a(i) is reduced) and will move toward cell $\Omega_j$ if $\delta z_j$ is negative (i.e. weighted area a(i) is increased). Moreover, as the intensities are proportional to the (weighted) areas of the cells, minimizing the sum S is equivalent to minimizing the sum $$\sum = \sum_{i=1}^{N} |a(i) - a_i|^2,$$

where $a_i$ is the area value corresponding to the target intensity $I_i$, i=1, . . . , N. The weighted area a(i) can be seen as a parameter associated with the cell $\Omega_i$, and varying the heights of the vertices of the paraboloids is equivalent to modifying the parameters of the cells forming a partition of the window's area. Weighted area a(j) results from the intersections of the paraboloids and can be calculated by means of the above mentioned trace function as (integration is performed over the (x,y) plane of window's area):

$$a(j) = \frac{I(j)}{I_0} = \iint t(x, y) \prod_{i=1, i \neq j}^{N} H[f_j(x, y) - f_i(x, y)] dx dy.$$

The above reasoning with the example of paraboloid surfaces remains true even if the expression of the piece of surface directly derived from the stationarity of the optical path length is not approximated or is approximated by its Taylor expansion to any (even) order k>2 (as the resulting expression still describes a surface of revolution): at an iteration step n of the minimization operation, the set of values $\{z_i^{(n)}, i=1, \ldots, N\}$ determines a set of cells $\{\Omega_i^{(n)}, i=1, \ldots, N\}$ representative of the intersections of the N pieces of surfaces $\{z=f_i^{(n)}(x,y), i=1, \ldots, N\}$ and a corresponding set of weighted cell areas $\{a^{(n)}(i), i=1, \ldots, N\}$ with $a^{(n)}(j)=\iint \Pi_{i=1,i\neq j}^N t(x,y) H[f_j^{(n)}(x,y)-f_i^{(n)}(x,y)] dx\, dy$, the constraint is that $$\sum_{i=1}^{N} a^{(n)}(i) = A$$

and the cost function is $$\sum_{i=1}^{N} |a^{(n)}(i) - a_i|^2.$$

The approximation of the light-redirecting surface is described by:

$$F^{(n)}(x, y) \sim \sum_{j=1}^{N} f_j^{(n)}(x, y) \prod_{i=1, i \neq j}^{N} H\left[f_j^{(n)}(x, y) - f_i^{(n)}(x, y)\right].$$

The process of minimizing the functional (i.e. the cost function)

$$\sum = \sum_{i=1}^{N} |a(i) - a_i|^2$$

can be performed according to any known minimization method like, for example, the (derivative-free) Nelder-Mead simplex method (J. A. Nelder and R. Mead, "A simplex method for function minimization", The Computer Journal, vol. 7 (4), 1965, pp 308-313). Of course, other derivative-free optimization methods can be used, e.g. the coordinate descent method (see: Stephen J. Wright, "Coordinate Descent Algorithms", Mathematical Programming, vol. 151 (1), June 2015, pp 3-34) or the Multilevel Coordinate Search ("MCS") method (see: W. Huyer and A. Neumaier, "Global Optimization by Multilevel Coordinate Search", Journal of Global Optimization, vol. 14 (4), June 1999, pp 331-355).

According to the invention, and with the above piecewise representation of the light redirecting surface, the technical problem of calculating the light-redirecting surface of a caustic layer including a mask layer that is adapted to redirect incident light received from a light source to form a projected image containing a given caustic pattern (i.e. a given distribution of non-zero light intensity) of a target image is thus solved by:

providing a discrete representation of an input target image comprising a set P of N image pixels $p_i$ of coordinates $\{(x_i, y_i)\}$, i=1, ... N, in the image plane with associated nonzero target light intensities $\{I_i\}$ distributed within a given area of the target image and corresponding to a target caustic pattern of the target image;

computing a piecewise light-redirecting surface z=F(x,y) of the caustic layer, with height z above the (x,y) coordinates plane, based on a representation of the light-redirecting surface by means of intersecting pieces of surfaces $f_i(x,y)$, i=1, ..., N, respectively obtained from the stationarity of the optical path length of rays refracted, or reflected, by the caustic layer and focused on points P(i) of the image plane of coordinates $(x_i, y_i)$, i=1, ..., N, wherein each piece of surface $z=f_i(x,y)$ is a surface of revolution around an axis passing through the point P(i) and having a vertex at point $(x_i, y_i, z_i)$, with height $z_i=f_i(x_i,y_i)$, i=1, ..., N, the piecewise light-redirecting surface associated with respective values of the heights of the N vertices being formed by the envelope of the intersections of the corresponding N pieces of surfaces;

for a given set of respective values of heights $z_1, \ldots, z_N$ of the vertices of the N pieces of surfaces, calculating a corresponding set of values of light intensities I(1), ..., I(N) which are respectively focused on the points P(1), ..., P(N) by the caustic layer redirecting incident light via the associated piecewise light-redirecting surface; and calculating the respective values of the N heights $z_1, \ldots, z_N$ of the N vertices of the corresponding N pieces of surfaces which minimize the differences between the respective values of calculated light intensities I(1), ..., I(N) focused on the points P(1), ..., P(N) via the associated light-redirecting surface and the respective corresponding values of the target light intensities $I_1, \ldots, I_N$.

For example, with the minimization of the cost function Σ via the simplex method of Nelder and Mead, the optimization starts with a set of N+1 points Q(1), ..., Q(N+1), located at the vertices of a non-degenerate simplex S in the optimization N-dimensional space (i.e. the N heights $z_1, \ldots, z_N$) and the corresponding set of cost function values $$\sum_{i=1}^{N+1} Q(i).$$

The method then performs a sequence of transformations of the working simplex S, aimed at decreasing the cost function values at its vertices. At each step the transformation is determined by computing one or more test points, together with their cost function values, and by comparing these cost function values with those at the current vertices, with the aim of substituting the worst vertex, i.e. the one with the largest cost function value, with a better one. The test points can be selected according to one out of four heuristics: (i) reflection or (ii) expansion away from the worst vertex; or (iii) shrinkage or (iv) contraction towards the best vertex(es). The minimization terminates when the working simplex S has become sufficiently small or when the cost function values at the vertices are close enough. By means of the four heuristic transformations, the Nelder-Mead algorithm typically requires only one or two function evaluations at each step, while many other direct search methods use at least N cost function evaluations. An intuitive explanation of the Nelder-Mead algorithm is given in (Press, WH; Teukolsky, S A; Vetterling, W T; Flannery, B P (2007). "Section 10.5. Downhill Simplex Method in Multidimensions". Numerical Recipes: The Art of Scientific Computing (3rd ed.). New York: Cambridge University Press. ISBN 978-0-521-88068-8.):

"The downhill simplex method now takes a series of steps, most steps just moving the point of the simplex where the function is largest ("highest point") through the opposite face of the simplex to a lower point. These steps are called reflections, and they are constructed to conserve the volume of the simplex (and hence maintain its nondegeneracy). When it can do so, the method expands the simplex in one or another direction to take larger steps. When it reaches a "valley floor," the method contracts itself in the transverse direction and tries to ooze down the valley. If there is a situation where the simplex is trying to "pass through the eye of a needle," it contracts itself in all directions, pulling itself in around its lowest (best) point."

According to a preferred mode of the invention, the optimal light-redirecting surface is advantageously obtained by means of the (generalized) power diagram method (also known as the Voronoi diagram method or the Laguerre/Voronoi diagram method (see F. de Goes et al., "Blue Noise through Optimal Transport", CAN Transactions on Graphics, vol. 31 (6), (SIGGRAPH Asia) 2012) (see also the web site http://www.geometry.caltech.edu/BlueNoise/, with available source code). Indeed, this method is powerful and it is proven that, in a case corresponding to the optimization problem of the invention, the power diagram method as a unique solution " . . . for any prescribed capacity constraints", as minimizing a concave function of the weights (not to be confused with the weights of the cell areas due to the transmission coefficient t(x,y)), the weights $w_i$ corresponding here to the heights $z_i$ and the capacities $m_i$ corresponding here to the cell weighted areas a(i) (see particularly the appendix of the above cited paper of de Goes et al.).

Since any image can be approximated by a finite collection of pixels, a caustic surface can be approximated by the composition of the corresponding pieces of surfaces (e.g. paraboloids). Hence, given a target image $I_t(x',y')$, the problem of calculating the caustic surface that generates it reduces to finding the appropriate set of weights NO for a given set of points approximating $I_t(x',y')$.

Under the hypothesis of optimum transport (see the above mentioned article of de Goes et al.), this is equivalent to finding the weights $\{w_i\}$ (here heights $\{z_i\}$) for the power diagram of the sites $\{(x_i,y_i)\}$, such that the capacities $\{m_i\}$ (here weighted cell areas $\{a(i)\}$) are proportional to the target image intensities $\{I_t(x_i,y_i)\}$. Once an optimal set of heights $\{z_i, i=1, \ldots, n\}$ and the corresponding cell boundaries $\partial\Omega_i$ (of cells $\Omega_i$ of weighted areas a(i)), are obtained via the power diagram method, the piecewise surface is reconstructed by considering the intersections of the cylinders, built along the axis z and of which bases are formed by the boundaries of the cells, with the respective pieces of surfaces with vertices at said obtained heights. In a preferred mode, the pieces of surfaces are approximated by paraboloids: in this case the boundary $\partial\Omega_i$ of a cell $\Omega_i$ is polygonal and calculations of distances of a point to the boundary and gradients are greatly simplified. In more general case (i.e. the pieces of surfaces are not approximated, or are approximated via a Taylor expansion of order greater than 2), a boundary $\partial\Omega_i$ of a cell $\Omega_i$ is still a closed curve but composed of curved lines, and the above mentioned calculations of distances of a point to the boundary and gradients are more complex.

Minimizing over the $w_i$ the functional $\Sigma_i|m_i-I_i|^2$ can be solved by a mere gradient descent algorithm (see, for example, the above mentioned paper of F. de Goes et al.). The process starts from an initial set of $\{w_i\}$ (most often by taking all the values equals), and then converges towards an optimal set $\{w_i\}$ of a corresponding partition into cells $\Omega_i$ of capacities $m_i$. Then from the resulting optimal set $\{w_i\}$ the set of heights of the paraboloid elements $\{z_i\}$ is obtained, and from the boundaries $\partial\Omega i$ of the resulting polygonal cells $\Omega_i$, by intersection of the vertical (along z) cylinders of basis $\partial\Omega i$ with the paraboloids, the final piece-wise caustic surface is built.

The caustic layer having the light-redirecting surface computed and designed according to the present invention forms a projected image that comprises a caustic pattern reproducing a reference pattern that is easily recognizable by a person, using no further means (i.e. with naked eye) or common and easily available means, so that an object marked with this optical security element can be readily authenticated visually by the person. The transparent aspect of the refractive optical security element makes it particularly suitable for marking at least partially transparent substrates (e.g. glass or plastic bottles, bottle caps, watch glasses, jewelry, gems, etc.).

The disclosed method for designing a refractive transparent or partially transparent light-redirecting surface, or a reflective light-redirecting surface, of a caustic layer is fast, scaled, reliable and accurate. It enables to significantly reduce the number of iterations required to go from a target image to the corresponding surface, since no corrections or adjustments are required. This also reduces the overall time required for designing.

Also, a step of calculating and integrating the normal field is eliminated and efficient optimization technique via minimization of capacity constraints is provided.

Besides, user intervention beyond that of specifying the target image and accepting the resulting surface is fully eliminated. Removing the need for user intervention significantly simplifies the implementation of the method in a production context, where specialized skills are not necessarily available.

Another method of designing a relief pattern of a caustic layer including a mask layer is described below, on the example of optical element shown of FIG. 2. This method is adapted from the method of "inverse caustic design", as detailed in the European patent EP 2 963 464 B1 of M. Pauly, R. Testuz and Y. Schwartzburg, by introducing the presence of the mask layer having a variable local transmission coefficient (according to the mask pattern). The method of Pauly and al. (see EP 2 963 464 B1, particularly FIG. 2 and paragraphs [0047] to [0073]) first finds an optimal mapping of how each light ray, defined by direction and intensity at each point of the light-redirecting surface, must be diverted in order to produce a given output light distribution at a specified plane. Given this mapping, we can find a normal orientation to each point on the surface such that using Snell's law, the outgoing ray intersects the assigned output point. This results in a target normal field. Then, a continuous surface that has this normal field as a property must be found. This field is usually not integrable: it is necessary to find a surface that matches this field as closely as possible, using for example, Poisson integration or solving a similar non-linear equation. These steps are then iterated until convergence.

The adapted method from that of Pauly and al. involves the following steps of:
- providing an initial geometry of a refractive or reflective light-redirecting surface (see the surface (5) of FIG. 2 of EP 2 963 464 B1) of a caustic layer including a mask layer;
- discretizing the initial light-redirecting surface with a mesh, the mesh representing incident illumination through the mask layer on said surface, where each position $x_s$ of a vertex of the mesh comprises an incoming direction and an intensity value of a light ray;
- generating a Voronoi diagram of a set S of sites of the mesh on the initial light-redirecting surface;
- discretizing a target surface with a mesh, wherein the positions of the vertices of the mesh and the ray directions are initialized from the refractive or reflective light-redirecting surface and the incident illumination;
- tracing rays from a light source through the refractive or reflective light-redirecting surface at the positions $x_s$ of the vertices of the mesh onto a receiver (see the receiver screen (3) of FIG. 2, and FIG. 7, of EP 2 963 464 B1) to obtain a piecewise linear representation of a source irradiance $E_S$ on the receiver, wherein each site $s_i$ of a set S of sites on the receiver approximately represents the same amount of flux $\Phi_i$;
- determining (see § [0047]-[0049] of EP 2 963 464 B1) a target position $x_R$ on the receiver for each light ray that leaves the refractive or reflective light-redirecting surface of the caustic layer such that the overall irradiance distribution on the receiver closely matches a target irradiance $E_T$, and determining how each Voronoi cell $C_i$ of the Voronoi diagram on the light-redirecting surface needs to be deformed and moved such that its flux $\Phi_i$ is distributed to match the target distribution ET, the determining including (see § [0023] and of EP 2 963 464 B1):
  (i) determining normals on the light-redirecting surface for each vertex of the mesh using Snell's law from the target positions $x_R$ on the receiver for each light ray;
  (ii) moving the vertices to best match the target surface normals while respecting the flux densities $\Phi_i$;
  iterating steps (i) and (ii); and
  upon convergence of the above iterations, integrating the normals on the light-redirecting surface to obtain the optimized target surface (see surface (7) of FIG. 2 of EP 2 963 464 B1).

A further method of designing a relief pattern of a caustic layer including a mask layer is based on the method of M. Papas, W. Jarosz, W. Jacob, S. Rusinkiewicz, W. Matusik and T. Weyrich: "Goal-based Caustics", EUROGRAPHICS 2010, M. Chen and O. Deussen (Guest Editors), volume 30, Number 2, 2011. See also the U.S. Pat. No. 9,188,783 B2 of these authors. These documents disclose techniques for designing and manufacturing a surface that produces a desired image when illuminated by a light source. The desired image is decomposed into a collection of Gaussian kernels. A shape of a micropatch lens corresponding to each Gaussian kernel is determined, and the resulting micropatch lenses are assembled to form a highly continuous surface that will cast an approximation of the desired image formed form the sum of a plurality of Gaussian caustics. The disclosed techniques may be used to create a design for a light-redirecting surface amenable to milling or other manufacturing process.

Particularly, the U.S. Pat. No. 9,188,783 B2 (see col. 5, lines 3-36 and FIG. 2), and the above cited article (see section 4, Gaussian Image Decomposition) explain how to approximate images using nonnegative linear combinations of m anisotropic Gaussian kernel functions $$f(x) = \sum_{i=0}^{m} \frac{w_i}{2\pi \sqrt{\det \sum_i}} \exp\left(-\frac{1}{2}(x-\mu_i)^T \sum_i^{-1} (x-\mu_i)\right)$$

wherein the parameters to be computed are the weights $w_i$, means $\mu_i$, and covariance matrices $\Sigma_i$ of a two-dimensional m-term Gaussian Mixture Model (GMM). In the method of Papas et al., the weights have all a same value $$w_i = \frac{1}{m}, i = 1, \ldots, m.$$

However, in presence of a mask layer, the weight associated with each patch need to be adjusted by the (mean) transmission coefficient of the mask layer for the corresponding area of the patch. Thus, if $t_i$ designates the mean transmission coefficient of the mask layer for the area i of the patch, we must use in the above linear combination a variable weight $$w_i = \frac{1}{m} * t_i, i = 1, \ldots m,$$

instead of the uniform weight of Papas et al. With this weight modification, the remaining steps of the method of Papas et al. are the same as disclosed in the cited patent and article.

The above disclosed subject matter is to be considered illustrative, and not restrictive, and serves to provide a better understanding of the invention defined by the independent claims.

The invention claimed is:
1. An optical element comprising a caustic layer made of a piece of reflective, or refractive transparent or partially transparent, first optical material, and having a light-redirecting surface with a relief pattern,
   wherein
      the optical element includes a mask layer disposed, respectively, on an optical surface of the optical element or within the optical element, the mask layer comprising a mask pattern and having a variable light transmission coefficient, the mask layer being adapted to at least partially transmit incoming light upon illumination of the optical element with a point-like light source; and
      the relief pattern of the light-redirecting surface of the caustic layer is configured to redirect incident light received by the optical element from the point-like light source and form a projected image containing a visible caustic pattern reproducing a reference pattern, wherein
      the point-like light source is a source of light whose angular size is sufficiently small that light can be considered to arise from a single point.
2. The optical element according to claim 1, wherein, upon illumination of the optical element with the point-like light source, the mask layer is configured to show a visible image reproducing a reference image, the visible image being distinct from the projected image.

3. The optical element of any one of claim 1, wherein a profile of a depth of the relief pattern has abrupt variations formed by machining a surface of the piece of first optical material according to a calculated relief pattern profile having discontinuities, said machined abrupt variations corresponding to the discontinuities.

4. The optical element according to claim 3, wherein the profile of the relief pattern has a maximum depth less than or equal to 250 μm.

5. The optical element according to claim 1, wherein the relief pattern of the light-redirecting surface is adapted to redirect incident light received from the light source, at a distance $d_s$ from the light-redirecting surface, and form the projected image containing the caustic pattern on a wall surface at a distance $d_i$ from the light-redirecting surface, with a value of $d_i$ less than or equal to 30 cm and a value of the ratio $d_s/d_i$ greater than or equal to 5.

6. The optical element according to claim 1, further comprising a lens element adjacent to the caustic layer and made of a refractive transparent or partially transparent second optical material, the lens element being configured to redirect incident light received by the optical element from the light source to form the projected image containing the visible caustic pattern reproducing the reference pattern, and wherein
   the light-redirecting surface has a focal length $f_C$; and
   the lens element has a focal length $f_L$ configured to form the projected image containing the visible caustic pattern directly on a retina of an observer looking at the light source through the optical element.

7. The optical element according to claim 6, comprising one of the following:
   a) the caustic layer has a positive focal length ($f_C>0$) and the lens element has a negative focal length ($f_L<0$), or
   b) the caustic layer has a negative focal length ($f_C<0$) and the lens element has a positive focal length ($f_L>0$).

8. The optical element according to claim 7, wherein a relationship between the focal length $f_L$ of the lens element and the focal length $f_C$ of the caustic layer satisfies following equation:

$$R - \left(\frac{1}{f_L} + \frac{1}{f_C} - \frac{1}{d_s}\right)^{-1} \geq d_R,$$

where:
   R is distance between the caustic layer and an eye of the observer;
   $d_s$ is a distance between the light source and the optical element; and
   $d_R$ is a reading distance from the eye, which is at least 25 cm.

9. The optical element according to claim 1, marking an object selected from the group comprising: consumer products, value documents, tax stamps, and banknotes.

10. A method of visually authenticating an object, marked with the optical element with a mask layer according to claim 1, by an observer, comprising steps of:
   illuminating the optical element with a point-like light source;
   visually observing the projected image containing the visible caustic pattern reproducing the reference pattern; and
   deciding that the object is genuine upon evaluation by the observer that the caustic pattern is visually similar to the reference pattern, wherein
   the point-like light source is a source of light whose angular size is sufficiently small that light can be considered to arise from a single point.

11. The method according to claim 10, wherein, upon illumination of the optical element with the point-like light source, the mask layer is configured to show a visible image reproducing a reference image, the method comprising a further step of visually observing the visible image reproducing the reference image, and wherein the step of deciding that the object is genuine comprises a further verification by the observer that the visible image is visually distinct from the caustic pattern.

12. A method of designing a relief pattern of a light-redirecting surface of a caustic layer made of a piece of refractive transparent or partially transparent, or reflective, first optical material, the caustic layer including a mask layer disposed, respectively, on an optical surface of the optical element or within the optical element, the mask layer comprising a mask pattern and having a variable light transmission coefficient, the mask layer being adapted to at least partially transmit incoming light upon illumination of the optical element with a point-like light source, the caustic layer being adapted to redirect incident light received from the point-like light source and form a projected image containing a caustic pattern, the method comprising the computer implemented steps of:
   providing a discrete representation of an input target image of a reference pattern comprising a set P of N image pixels $p_i$ of coordinates $\{(x_i,y_i)\}$ in the image plane with associated nonzero target light intensities $\{I_i\}$, i=1, ..., N, distributed within a given area of the target image and corresponding to a target caustic pattern of the target image;
   computing a piecewise representation of the light-redirecting surface $z=F(x,y)$ of the caustic layer, with height z above the (x,y) coordinates plane, based on a representation of the light-redirecting surface by means of intersecting pieces of surfaces $z=f_i(x,y)$, i=1, ..., N, respectively obtained from the stationarity of an optical path length of rays refracted, or reflected, by the caustic layer and focused on points P(i) of the image plane of coordinates $(x_i,y_i)$, i=1, ..., N, wherein each piece of surface $z=f_i(x,y)$ is a surface of revolution around an axis passing through the point P(i) and having a vertex at point $(x_i,y_i,z_i)$, with height $z_i=f_i(x_i,y_i)$, i=1, ..., N, the piecewise representation of the light-redirecting surface associated with respective values of the heights of the N vertices being formed by an envelope of the intersections of the corresponding N pieces of surfaces $z=f_i(x,y)$, i=1, ..., N;
   for a given set of respective values of heights $z_1, ..., z_N$ of the vertices of the N pieces of surfaces, calculating a corresponding set of values of light intensities I(1), ..., I(N) which are respectively focused on the points P(1), ..., P(N) by the caustic layer redirecting incident light via the associated piecewise light-redirecting surface according to the variable light transmission coefficient of the mask pattern; and
   calculating the respective values of the N heights $z_1, ..., z_N$ of the N vertices of the corresponding N pieces of surfaces which minimize the differences between the respective values of calculated light intensities I(1), ..., I(N) focused on the points P(1), ..., P(N) via the associated light-redirecting surface and the respective corresponding values of the target light intensities $I_1, ..., I_N$.

thereby obtaining the light-redirecting surface having a relief pattern adapted to redirect incident light received from the light source by the optical element comprising the mask layer and form a projected image containing the target caustic pattern reproducing the reference pattern; wherein the point-like light source is a source of light whose angular size is sufficiently small that light can be considered to arise from a single point.

13. The optical element according to claim 3, wherein the profile of the relief pattern has a maximum depth less than or equal to 30 μm.

14. The method according to claim 12, wherein each piece of surface $z=f_i(x,y)$, $i=1, \ldots, N$, is approximated by taking, within a paraxial approximation, a Taylor expansion of order k greater or equal than two of an expression of the piece of surface obtained from the stationarity of the optical path length.

15. The method according to claim 12, wherein the obtained light-redirecting surface is used to generate a machine-compatible representation for controlling a machining tool to machine the light-redirecting surface of the caustic layer.

* * * * *